US012598880B2

(12) United States Patent
Park et al.

(10) Patent No.: US 12,598,880 B2
(45) Date of Patent: Apr. 7, 2026

(54) DISPLAY DEVICE AND METHOD FOR PROVIDING THE SAME

(71) Applicant: Samsung Display Co., LTD., Yongin-si (KR)

(72) Inventors: Han Ho Park, Yongin-si (KR); Eui Jeong Kang, Suwon-si (KR); Min Hee Park, Hwaseong-si (KR); Jeong Eun Park, Goyang-si (KR); Joong Mok Lee, Suwon-si (KR); Chung Seok Lee, Hwaseong-si (KR); Suk Ho Choi, Seongnam-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 360 days.

(21) Appl. No.: 18/177,928

(22) Filed: Mar. 3, 2023

(65) Prior Publication Data

US 2023/0301148 A1    Sep. 21, 2023

(30) Foreign Application Priority Data

Mar. 16, 2022    (KR) ........................ 10-2022-0032525

(51) Int. Cl.
*H10K 59/131*        (2023.01)
*H10K 59/12*         (2023.01)
(Continued)

(52) U.S. Cl.
CPC ....... *H10K 59/131* (2023.02); *H10K 59/1201* (2023.02); *H10K 59/80* (2023.02); *H10K 77/111* (2023.02); *H10K 2102/311* (2023.02)

(58) Field of Classification Search
CPC ............ H10K 77/111; H10K 2102/311; H10K 59/873; H10K 59/12; H10K 50/8426; H10K 50/86; H10K 71/00
See application file for complete search history.

(56) References Cited

U.S. PATENT DOCUMENTS 9,780,157 B2    10/2017    Kwon et al.
11,329,263 B2    5/2022    Park et al.
(Continued)

FOREIGN PATENT DOCUMENTS

CN        112885244 A      6/2021
CN        113066832 A      7/2021
(Continued)

*Primary Examiner* — Julia Slutsker
(74) *Attorney, Agent, or Firm* — CANTOR COLBURN LLP

(57)        ABSTRACT

A display device includes a substrate including a bending area, a flat area adjacent to the bending area, and first and second surfaces opposite to each other, a display unit corresponding to the flat area and on the first surface, a support layer which is on the second surface of the substrate, corresponds to the flat area, and is disconnected at the bending area to define an end portion closest to the bending area, and the substrate defining a groove in the bending area. The end portion of the support layer is bendable together with the substrate and includes a flat portion corresponding to the flat area of the substrate, and a bending portion corresponding to the bending area of the substrate. The substrate which is unbent disposes the bending portion having an acute angle of inclination with respect to the second surface of the substrate.

27 Claims, 22 Drawing Sheets

(51) Int. Cl.
  *H10K 59/80*      (2023.01)
  *H10K 77/10*      (2023.01)
  *H10K 102/00*     (2023.01)

(56)              References Cited

U.S. PATENT DOCUMENTS

| | | | |
|---|---|---|---|
| 2016/0181346 A1* | 6/2016 | Kwon | H10K 77/111 |
| | | | 257/40 |
| 2019/0341566 A1* | 11/2019 | Lee | H05K 1/147 |
| 2021/0408405 A1* | 12/2021 | Hu | H10K 71/00 |
| 2024/0206252 A1* | 6/2024 | Li | H10K 77/111 |

FOREIGN PATENT DOCUMENTS

| | | |
|---|---|---|
| KR | 10-0765478 B1 | 10/2007 |
| KR | 20170095809 A | 8/2017 |
| KR | 1020180066378 A | 6/2018 |
| KR | 20200099223 A | 8/2020 |
| KR | 1020200128258 A | 11/2020 |
| KR | 1020210086318 A | 7/2021 |
| KR | 1020210105723 A | 8/2021 |

* cited by examiner

| |
|---|
| TFEL |
| EML |
| TFTL |

1200: 1210, 1220, 1230

DISPLAY DEVICE AND METHOD FOR PROVIDING THE SAME

This application claims priority to Korean Patent Application No. 10-2022-0032525 filed on Mar. 16, 2022 in the Korean Intellectual Property Office, and all the benefits accruing therefrom under 35 U.S.C. 119, the contents of which in its entirety are herein incorporated by reference.

BACKGROUND

1. Field

The present disclosure relates to a display device and a method for manufacturing (or providing) the same.

2. Description of the Related Art

Various research and development of flat panel display devices have been made. Since the flat panel display device is thin and light in weight, a range of use thereof is expanding. In addition, as the flat panel display device may be flexible, the flat panel display device is easier to carry and the number of applications thereof is increasing.

SUMMARY

Since the flat panel display having flexibility may be bent or folded, there are advantages of reducing a size of the display device or improving visibility from various angles. However, since an overall thickness of the display device which is flexible is small, defects may easily occur in a process of manufacturing (or providing) the display device, manufacturing costs are high, and the lifespan of the display device may be reduced due to stress caused by bending.

Aspects of the present disclosure provide display device capable of reducing an area of a non-display area and a bending stress applied thereto.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an embodiment, a display device includes a substrate including a first flat area, a second flat area, and a bending area disposed between the first flat area and the second flat area and having a predetermined radius of curvature, a display unit overlapping the first flat area of the substrate and disposed on one surface of the substrate to display an image, a first support layer disposed on the other surface of the substrate overlapping the one surface of the substrate and overlapping the first flat area and a second support layer disposed on the other surface of the substrate with the first support layer and the bending area interposed therebetween and overlapping the second flat area. The substrate includes a groove that is concave in a thickness direction of the substrate in the bending area, and the first support layer includes a first flat portion overlapping the first flat area, and a first bending portion having a first acute angle of inclination with respect to the other surface of the substrate and overlapping the bending area.

The first bending portion may be bent with a predetermined first curvature.

The second support layer may include a second flat portion overlapping the second flat area, and a second bending portion may have a second acute angle of inclination with respect to the other surface of the substrate and overlapping the bending area.

The second bending portion may be bent with a predetermined second curvature.

The groove may have one end aligned with one end of the first bending portion and the other end aligned with one end of the second bending portion.

The substrate may include a first substrate, a first barrier layer, a second substrate and a second barrier layer sequentially disposed, the first barrier layer may be positioned on the one surface of the first substrate, the first support layer and the second support layer may be positioned on the other surface of the first substrate, and the groove may be formed (or provided) in the first substrate.

The groove may have a thickness smaller than a thickness of the first substrate.

The groove may have a thickness equal to a thickness of the first substrate, and the first barrier layer may be exposed by the groove.

The first barrier layer may include an inorganic material.

The inorganic material may include at least one of metal oxide, silicon oxide, and silicon nitride.

The substrate may include an organic material.

The substrate may include polyimide, polyethylenenapthalate, polyethyleneterephthalate (PET), polyarylate, polycarbonate, polyetherimide (PEI), or polyethersulfone.

The first substrate may include a thickness greater than a thickness of the second substrate.

The groove may have one end aligned with one end of the first bending portion.

The display device may further include an optical member disposed on the display unit; and a bending protection layer covering the bending area of the substrate and in contact with one side of the optical member. The bending protection layer has a thickness that becomes thinner from a side surface of the optical member toward the bending area, and has a uniform thickness in the bending area.

A method for manufacturing (or providing) a display device includes preparing (or providing) a display panel including a substrate having a first flat area, a bending area, and a second flat area defined along a first direction, and a display unit disposed in the first flat area of the substrate, coupling a first support layer, a second support layer, and an optical member to the display panel, forming (or providing) a bending protection layer in the bending area of the substrate, coupling a window member onto the optical member of the substrate, forming a first bending portion overlapping the bending area and having an acute angle of inclination on one side surface of the first support layer by laser patterning and forming a groove in the bending area of the substrate by laser patterning, and bending the bending area of the substrate and the first bending portion of the first support layer. The groove is concave in a thickness direction of the substrate.

In the forming of the first bending portion and the groove by the laser patterning, a second bending portion having an acute angle of inclination on one side surface of the second support layer may be further formed by laser patterning.

The first bending portion may overlap the bending area.

The second bending portion may overlap the bending area.

In the forming of the bending protection layer, a thickness of the bending protection layer may become thinner from a side surface of the optical member toward the bending area, and may be uniformly formed in the bending area.

A display device includes a display panel including a display area and a non-display area, a circuit board including a first flat area disposed in the non-display area and a second bending area extending from the first flat area and having a predetermined curvature, and a display driving circuit attached onto the circuit board. The circuit board has a concave groove in the bending area in a thickness direction on the other surface overlapping one surface disposed on the display panel.

The circuit board may further include an insulating layer defining a shape of the circuit board, a line layer disposed between the insulating layer and the display panel, and an insulating layer covering at least a portion of the line layer, and the groove may be formed on the insulating layer The insulating layer may not overlap the groove.

The groove may be formed in an entire bending area of the circuit board with the same breadth as a breadth of the bending area and the same width as a width of the bending area.

A plurality of grooves may be provided, and at least one groove may have one end overlapping a boundary between the flat area and the bending area.

The display device may further include a filler filled in a space defined by a side surface of the display panel and the other surface of the circuit board.

The filler may be in contact with the line layer in the bending area.

According to one or more embodiment of the display device, by reducing a thickness of a substrate in a bending area by a groove or opening defined in the substrate, since a radius of curvature is reduced, an increase in a non-display area may be prevented. Since the substrate is easily bent, it is possible to effectively reduce an overall size of the display device.

In addition, according to one or more embodiment of the display device, since one side surface of the support layer for supporting the substrate includes an edge portion having an acute angle inclined surface so that the edge portion supports a substrate bending area, it is possible to reduce bending stress applied to the substrate from bending thereof.

However, the effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail embodiments thereof with reference to the attached drawings, in which:

FIG. 8B is an enlarged view of a display unit according to an embodiment;

DETAILED DESCRIPTION

Figure 1:
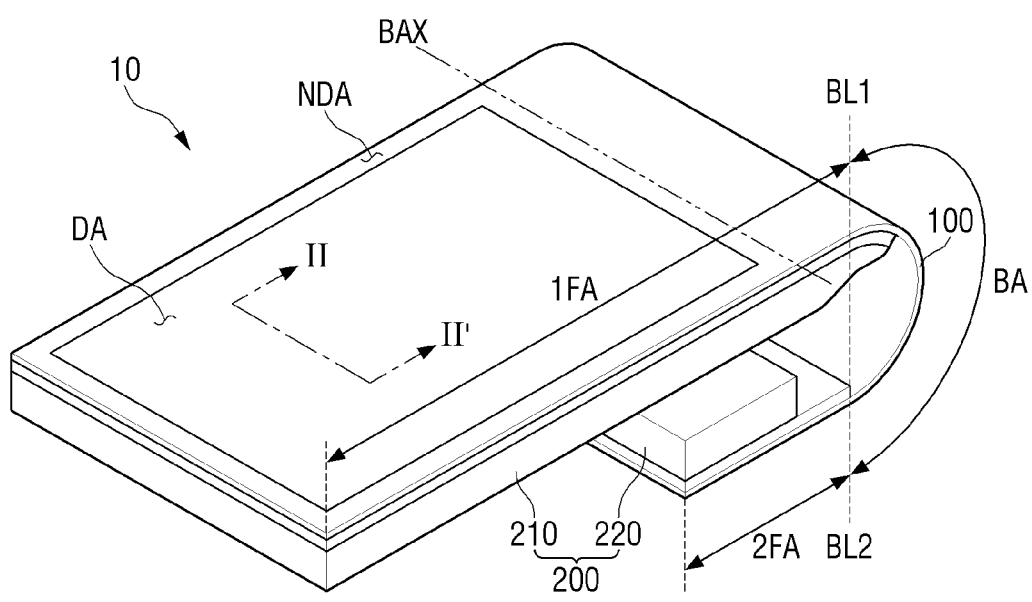
FIG. 1 is a perspective view schematically illustrating a portion of a display device according to an embodiment.
Figure 1:
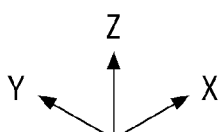

The embodiments will now be described more fully hereinafter with reference to the accompanying drawings. The embodiments may, however, be provided in different forms and should not be construed as limiting. The same reference numbers indicate the same components throughout the disclosure. As used herein, a reference number may indicate a singular element or a plurality of the element. For example, a reference number labeling a singular form of an element within the drawing figures may be used to reference a plurality of the singular element within the text of specification." In the accompanying figures, the thickness of layers and regions may be exaggerated for clarity.

Some of the parts which are not associated with the description may not be provided in order to describe embodiments of the disclosure.

It will also be understood that when a layer is referred to as being related to another layer such as being "on" another layer or substrate, it can be directly on the other layer or substrate, or intervening layers may also be present. In contrast, when an element is referred to as being related to another element such as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween.

It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10% or 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
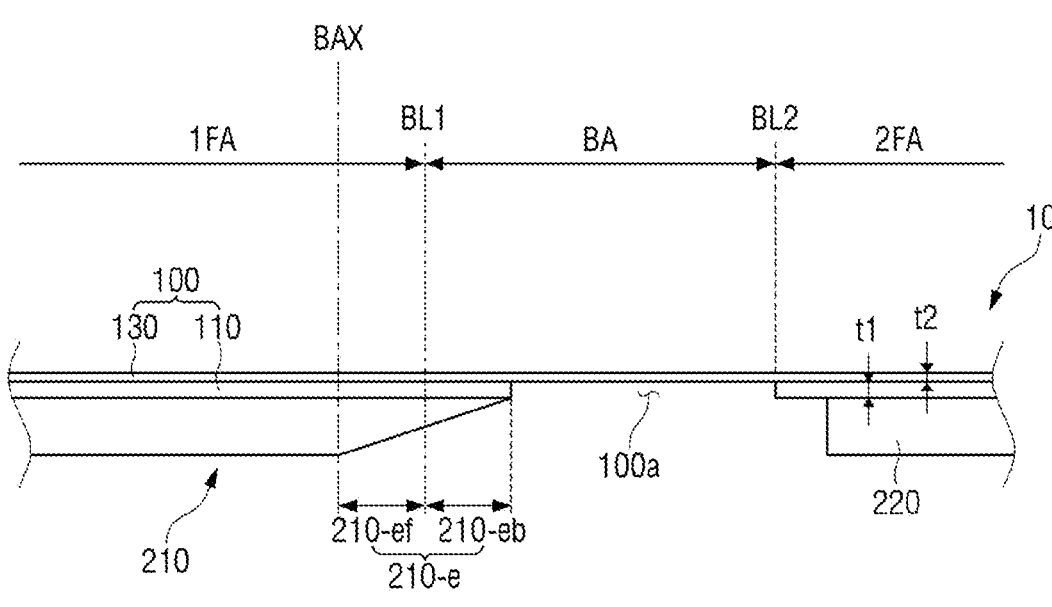
FIG. 2 is a cross-sectional view illustrating an unfolded state of a portion of the display device according to an embodiment.
Figure 2:
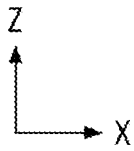
Figure 3:
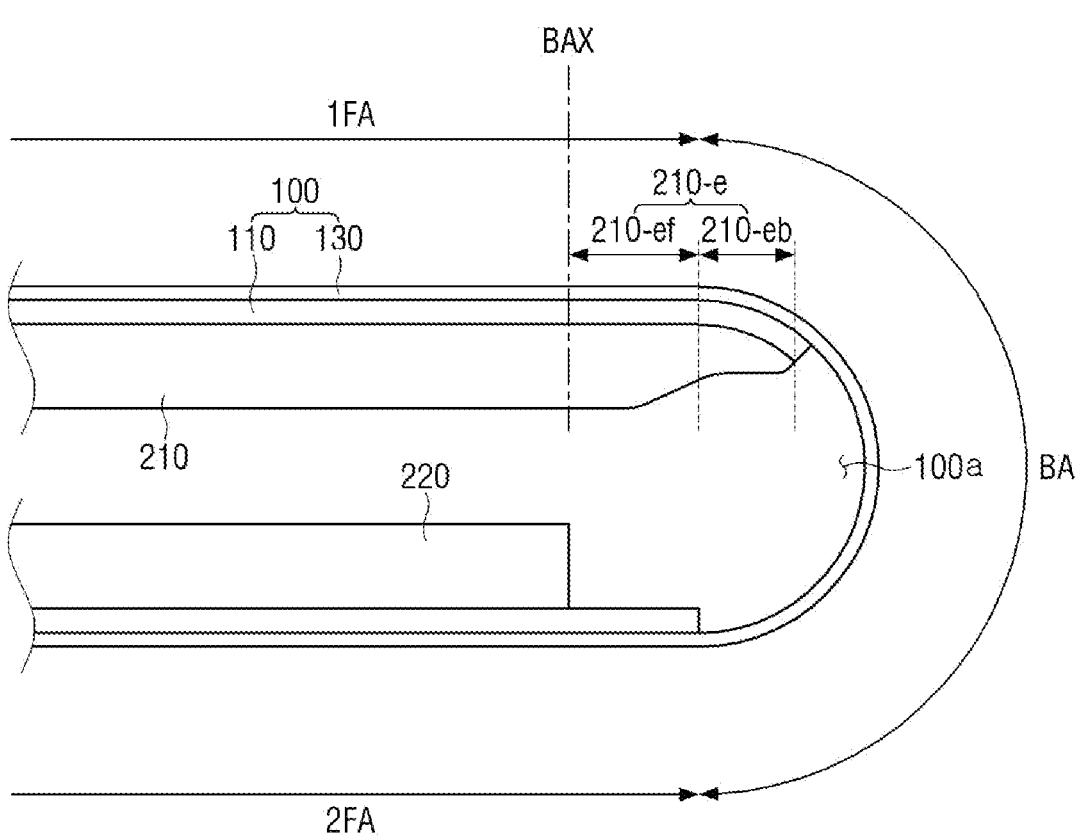
FIG. 3 is a cross-sectional view illustrating a bent state of a portion of the display device according to an embodiment.

FIG. 1 is a perspective view schematically illustrating a portion of a display device 10 according to an embodiment, FIG. 2 is a cross-sectional view illustrating a portion of the display device 10 which is unfolded (e.g., an unfolded state) according to an embodiment, and FIG. 3 is a cross-sectional view illustrating a portion of the display device 10 which is bent (e.g., a bent state) according to an embodiment.

Referring to FIGS. 1 to 3, a display device 10 according to an embodiment may be applied to portable electronic devices such as mobile phones, smartphones, tablet personal computers (PCs), mobile communication terminals, electronic notebooks, electronic books, portable multimedia players (PMPs), navigation devices, and ultra mobile PCs (UMPCs). Alternatively, the display device 10 according to an embodiment may be applied to a display unit of televisions, laptop computers, monitors, billboards, or the Internet of Things (IoT). Alternatively, the display device 10 according to an embodiment may be applied to wearable devices such as smart watches, watch phones, glasses-type displays, and head mounted displays (HMDs). Alternatively, the display device 10 according to an embodiment may be applied to a center information display (CID) disposed on an instrument board, a center fascia, or a dashboard of a vehicle, a room mirror display substituting for a side mirror of the vehicle, or a display disposed on a rear surface of a front seat as entertainment for a rear seat of the vehicle.

The display device 10 according to an embodiment may be a light emitting display device such as an organic light emitting display device using an organic light emitting diode, a quantum dot light emitting display device including a quantum dot light emitting layer, an inorganic light emitting display device including an inorganic semiconductor, and a micro light emitting display device using a micro or nano light emitting diode (micro LED or nano LED). Hereinafter, it is mainly described that the display device 10 according to an embodiment is the organic light emitting display device, but the present disclosure is not limited thereto.

In the display device 10 according to the present embodiment, a portion of the substrate 100 that is a portion of the display device 10 is bendable to be bent as illustrated in FIG. 1, so that a portion of the display device 10 which is on the substrate 100 also has a bent shape like the substrate 100. That is, various layers and components of the display device may be bendable together with each other, such as layers or components on the substrate 100 being bendable together with the substrate 100.

As illustrated in FIG. 1, a substrate 100 included in the display device 10 according to the present embodiment has a first flat area 1FA, a bending area BA, and a second flat area 2FA. The first flat area 1FA within a flat area of the display device 10 is formed (or KSA0702US provided) in a rectangular plane having a long side in a first direction (X-axis direction) and a short side in a second direction (Y-axis direction) which intersects the first direction (X-axis direction). The bending area BA is positioned between the first flat area 1FA and the second flat area 2FA in the first direction (X-axis direction).

The substrate 100 is bendable to be bent in the bending area BA about a bending axis BAX extending in the second direction (+Y-axis direction) as illustrated in FIG. 1. In this case, the display device 10 which is bent may dispose the second flat area 2FA at (or on) a lower surface of the first flat area 1FA to overlap the first flat area 1FA in (or along) a third direction (Z-axis direction) that is the thickness direction of the substrate 100.

The bending area BA may be an area (e.g., a planar area) defined by a first boundary BL1 disposed to be adjacent to the first flat area 1FA in the first direction (X-axis direction) and a second boundary BL2 disposed to be spaced apart from the first boundary BL1 in the first direction (X-axis direction). The bending area BA may be an area in which the display device 10 is bendable to be bent with (or to define) a predetermined radius of curvature when the display device 10 is bent in one direction. In this case, the radius of curvature of the display device 10 may be defined as a radius of a substantially circular shape formed when the bending area BA is bent.

The display device 10 may include a display area DA displaying an image and a non-display area NDA which is adjacent to the display area DA, such as being disposed around the display area DA in a top plan view (e.g., a view along the third direction of a plane defined by a first direction and a second direction crossing each other).

The display area DA may include a plurality of pixels, and may emit light generated in each pixel, in a display direction (e.g., a light-emitting direction). For example, the display direction may be a third direction (Z-axis direction).

The non-display area NDA may be disposed to be adjacent to the display area DA in the first direction (X-axis direction). Signal lines or driving circuits for applying signals (e.g., electrical signals) to a display unit 400 to be described later may be disposed in the non-display area NDA. The non-display area NDA may further include the bending area BA. The bending area BA may be included in the non-display area NDA. The bending axis BAX may be positioned on the non-display area NDA of the first flat area 1FA. That is, various components or layers of the display device 10 may include a display area DA and a non-display area NDA corresponding to those described above.

It is illustrated in the drawing that a boundary of the bending area BA does not overlap a boundary between the display area DA and the non-display area NDA, but the present disclosure is not limited thereto, and a boundary between the display area DA and the bending area BA adjacent thereto may overlap the boundary between the display area DA and the non-display area NDA.

The substrate 100 may include a plurality of substrates such as a first substrate 110 (e.g., a first substrate layer) and a second substrate 130 (e.g., a second substrate layer) which is disposed on the first substrate 110 in the second direction (+Z direction).

The first substrate 110 and the second substrate 130 may be formed of (or include) a flexible material capable of being bendable, foldable, rollable, and the like. As an optional example, the first substrate 110 and the second substrate 130 may be formed of an organic material. For example, the first substrate 110 and the second substrate 130 may include an organic material with excellent heat resistance and durability such as polyimide, polyethylenenapthalate, polyethylene-terephthalate (PET), polyarylate, polycarbonate, polyether-imide (PEI), or polyethersulfone.

The first substrate 110 may have a thickness t1 (e.g., a first thickness) greater than a thickness t2 (e.g., a second thickness) of the second substrate 130. In a non-limiting example, the first substrate 110 may have a thickness t1 of about 6 micrometers (μm) to about μm 13, such as, a thickness t1 of about 6 μm to about 10 μm. The second substrate 130 may have a thickness t2 of about 1 μm to about 6 μm, such as, a thickness t2 of about 3 μm to about 6 μm. That various thicknesses (t1, t2, etc.) described herein may be a maximum thickness of an element or a thickness without being deformed, without being limited thereto.

As illustrated in FIG. 2, the first substrate 110 may have (or define) a groove 100a corresponding to the bending area BA. The groove 100a has a shape that is concave in the third direction (Z-axis direction) that is the thickness direction of the first substrate 110. The groove 100a is open in a direction defined from the substrate 100 to the support layer. In addition, the groove 100a has a depth t3 equal to or smaller than the thickness t1 of the first substrate 110 in the third direction (Z-axis direction) of the first substrate 110.

For convenience of explanation, a surface on which a display unit 400 to be described later is disposed on the substrate 100 is referred to as one surface or a first surface. A surface which is opposite to the one surface may be referred to as the other surface or a second surface.

The display device 10 may further include a support layer including support layers 210 and 220 disposed on the other surface of the substrate 100 overlapping (or opposite to the one surface of the substrate 100. The support layers 210 and 220 are disposed on the other surface of the substrate 100 in an opposite direction to the second substrate 130.

The support layers 210 and 220 may prevent the substrate 100 from being bent by an external force or may reduce the degree of bending of the substrate 100. The support layers 210 and 220 may maintain portions of the substrate 100 in a relatively flat state even when an external force is applied to the substrate 100.

The support layers 210 and 220 may include a material having rigidity or semi-rigidity. Specifically, the support layers 210 and 220 may include a metal material such as stainless steel (SUS) or aluminum, a polymer such as polymethylmethacrylate (PMMA), polycarbonate (PC), polyvinyl alcohol (PVA), acrylonitrile-butadiene-styrene (ABS), or polyethylene terephthalate (PET), or the like.

The support layers 210 and 220 include a first support layer 210 and a second support layer 220 separated from each other in the first direction (X-axis direction). That is, the support layer as including a first support pattern and a second support pattern (e.g., the support layers 210 and 220, respectively) may be disconnected at the bending area BA. The first support layer 210 and the second support layer 220 may have the same thickness, but are not limited thereto.

The first support layer 210 includes an edge portion 210-e (e.g., an end portion) having (or defining) a predetermined inclination angle on a first side surface thereof facing the second support layer 220 across the bending area BA. The inclination angle has an acute angle of inclination with respect to the other surface of the substrate 100, and may be an acute angle of about 1 degree)(° to about 89°, such as in a range of about 20° to about 70°. The inclination angle may be an internal angle of the edge portion 210-e with the other surface of the substrate 100. In other words, the edge portion 210-e of the first support layer 210 is formed to be inclined with respect to the thickness direction (Z-axis direction), and has a thickness that becomes thinner in a direction from the first support layer 210 to the bending area BA with respect to the bending axis BAX. That is, the edge portion 210-e of the first support layer 210 has a thickness that becomes thinner (e.g., decreases) toward an outer portion of the first support layer 210 which is closest to the bending area BA.

One end of the edge portion 210-*e* which is closest to the bending area BA, may be aligned with one end of the groove 100*a* of the substrate 100 which is closest to the first support layer 210.

The edge portion 210-*e* may include a flat portion 210-*ef* overlapping (or corresponding to) the first flat area 1FA and a bending portion 210-*eb* overlapping (or corresponding to) the bending area BA. The display device 10 which is bent in one direction, may dispose the bending portion 210-*eb* of the first support layer 210 is bent together with having a predetermined radius of curvature.

The flat portion 210-*ef* of the edge portion 210-*e* overlaps the first flat area 1FA of the substrate 100, and the bending portion 210-*eb* of the edge portion 210-*e* overlaps the bending area BA of the substrate 100.

One end of the bending portion 210-*eb* of the edge portion 210-*e* may be aligned with one end of the groove 100*a* of the substrate 100.

A side surface of the second support layer 220 facing the first support layer 210 may have a linear shape. That is, an inclination angle of the side surface of the second support layer 220 may be about 90 degrees)(°.

Figure 4:
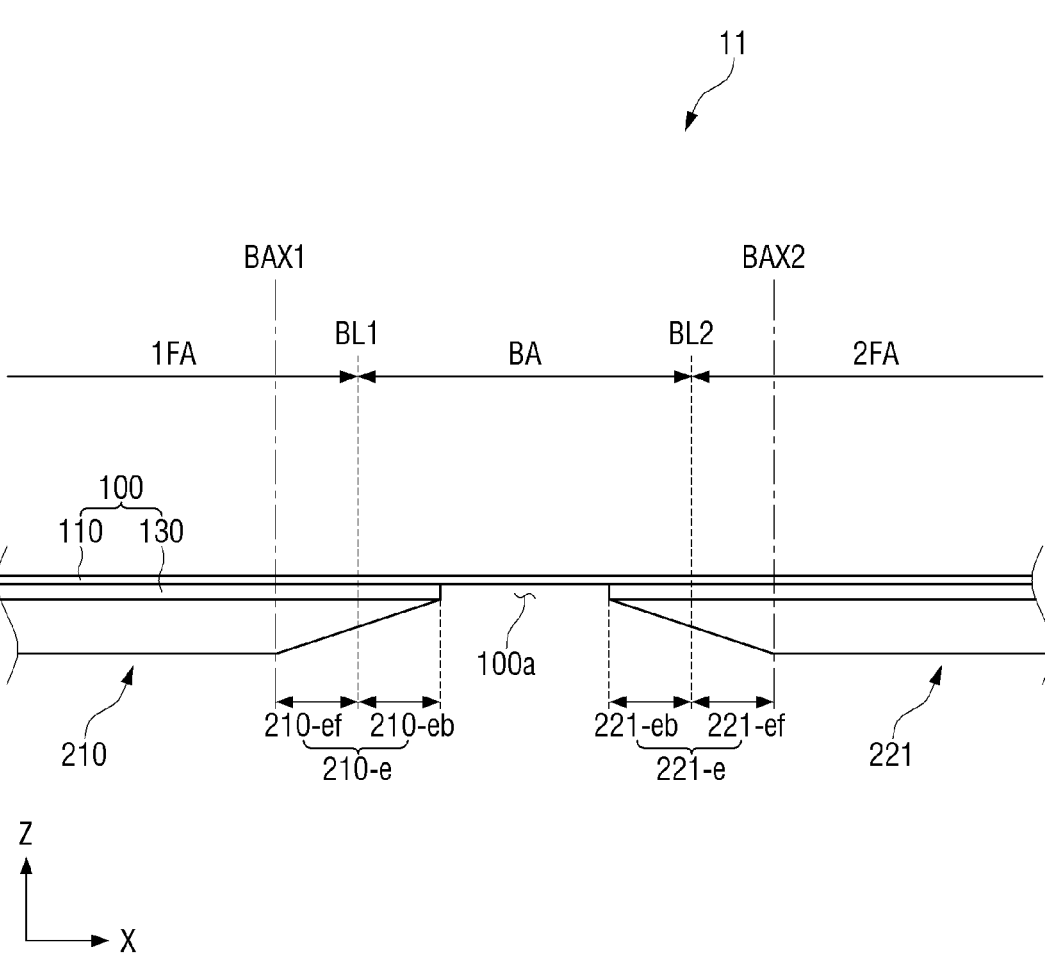
FIG. 4 is a cross-sectional view illustrating an unfolded state of a portion of a display device according to an embodiment.
Figure 5:
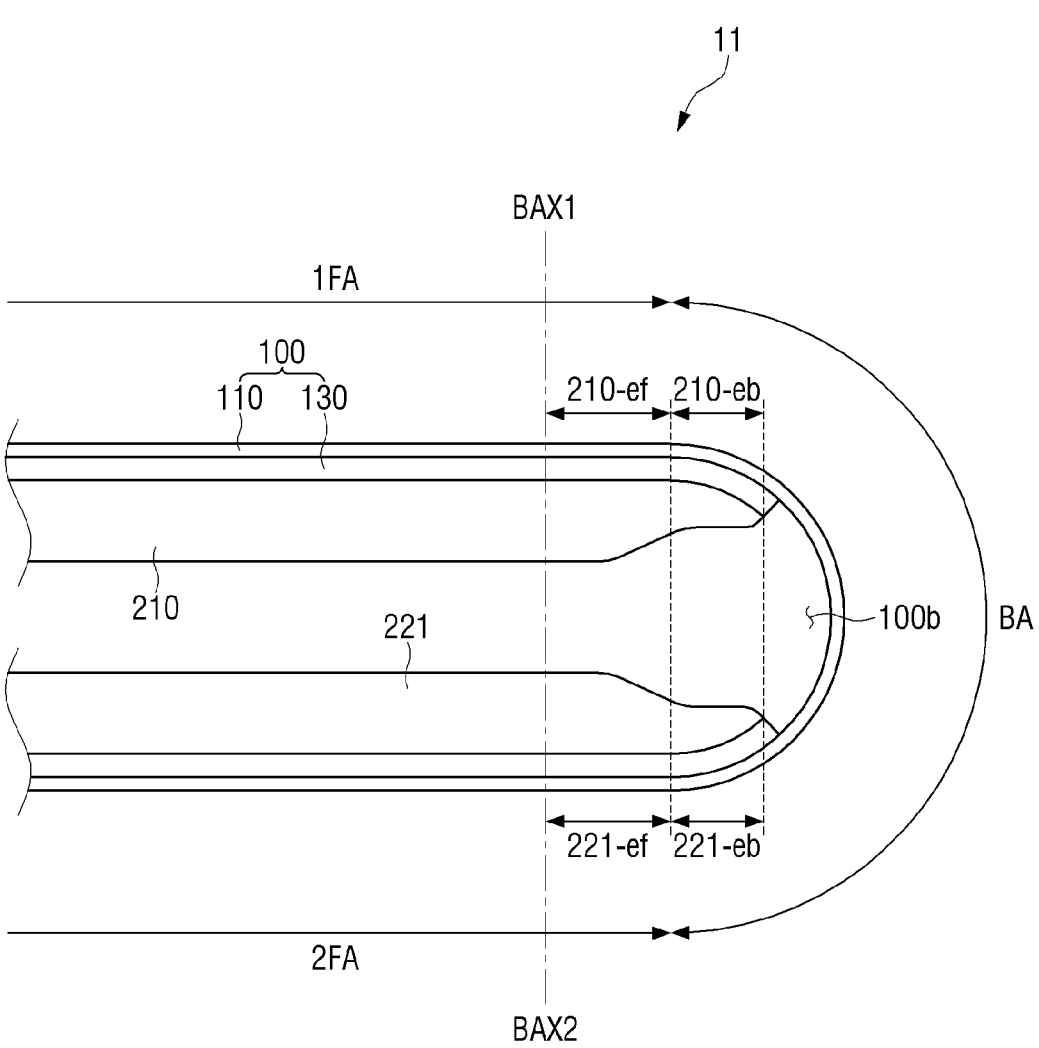
FIG. 5 is a cross-sectional view illustrating a bent state of a portion of the display device according to an embodiment.

FIG. 4 is a cross-sectional view illustrating a portion of a display device 11 which is unfolded (e.g., unfolded state) according to an embodiment and FIG. 5 is a cross-sectional view illustrating a portion of a display device 11 which is bent (e.g., bent state) according to an embodiment.

Since a display device 11 described with reference to FIGS. 4 and 5 is different from the display device 10 described with reference to FIGS. 1 to 3 only in a second support layer 221 and a groove 100*b*, a detailed description of the same components and structures will be omitted.

As illustrated in FIGS. 4 and 5, support layers 210 and 221 include a first support layer 210 and a second support layer 221 separated from each other in the first direction (X-axis direction). The first support layer 210 and the second support layer 221 may have the same thickness, but are not limited thereto. The first support layer 210 and the second support layer 221 may be disposed to partially overlap the bending area BA.

The first support layer 210 includes an edge portion 210-*e* having an inclination angle on a first side surface thereof facing the second support layer 221.

The edge portion 210-*e* of the first support layer 210 is formed to be inclined with respect to the thickness direction (Z-axis direction), and has a thickness that becomes thinner in a direction of the bending area BA with respect to a bending axis BAX1 (e.g., a direction from the bending axis BAX1 to the bending area BA). That is, the edge portion 210-*e* of the first support layer 210 has a thickness that becomes thinner toward an outer portion of the first support layer 210.

One end of the edge portion 210-*e* may be aligned with one end of the groove 100*b* of the substrate 100.

The edge portion 210-*e* may include a flat portion 210-*ef* and a bending portion 210-*eb*. When the display device 11 is bent in one direction, the bending portion 210-*eb* of the edge portion 210-*e* is bent while having a first curvature. The flat portion 210-*ef* of the edge portion 210-*e* overlaps the first flat area 1FA of the substrate 100, and the bending portion 210-*eb* of the edge portion 210-*e* overlaps the bending area BA of the substrate 100. The bending portion 210-*eb* has a first acute angle of inclination with respect to the other surface of the substrate 100 (the surface on which the first support layer 210 is disposed).

The second support layer 221 includes an edge portion 221-*e* having an inclination angle on a first side surface thereof facing the first support layer 210. The edge portion 221-*e* of the second support layer 221 is formed to be inclined with respect to the thickness direction (Z-axis direction), and has a thickness that becomes thinner in a direction of the bending area BA with respect to a bending axis BAX2. That is, the edge portion 221-*e* of the second support layer 221 has a thickness that becomes thinner toward an outer portion of the second support layer 221.

One end of the edge portion 221-*e* may be aligned with one end of the groove 100*b* of the substrate 100. That is, the groove 100*b* defined by the substrate 100 includes a first end aligned with an end of the first bending portion which is closest to the bending area BA, and a second end which is opposite to the first end and aligned with an end of the second bending portion.

The edge portion 221-*e* may include a flat portion 221-*ef* and a bending portion 221-*eb*. When the display device 11 is bent in one direction, the edge portion 221-*e* is bent while having a second curvature. The bending portion 221-*eb* has a second acute angle of inclination with respect to the other surface of the substrate 100 (the surface on which the first support layer 210 is disposed). That is, the substrate 100 which is unbent disposes the first bending portion 210-*eb* having a first acute angle of inclination with respect to the second surface of the substrate 100, together with the second bending portion 221-*eb* having a second acute angle of inclination with respect to the second surface of the substrate 100. The substrate 100 which is bent disposes the first bending portion 210-*eb* of the support layer having a first curvature, together with the second bending portion 221-*eb* of the support layer having a second curvature.

The flat portion 221-*ef* of the edge portion 221-*e* overlaps the second flat area 2FA of the substrate 100, and the bending portion 221-*eb* of the edge portion 210-*e* overlaps the bending area BA of the substrate 100.

The groove 100*b* has one end aligned with one end of the bending portion 210-*eb* and the other end aligned with one end of the bending portion 221-*eb*.

Figure 6:
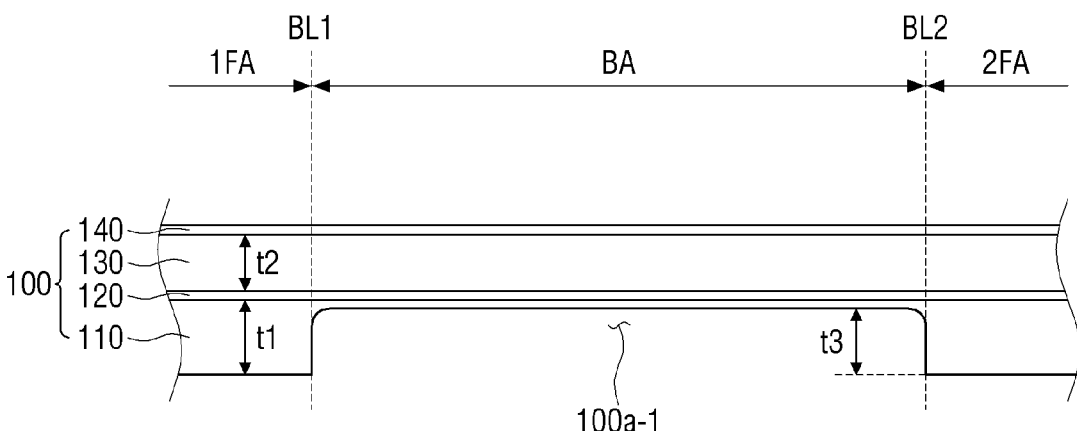
FIG. 6 is an enlarged view of a substrate of FIG. 2 according to an embodiment.
Figure 7:
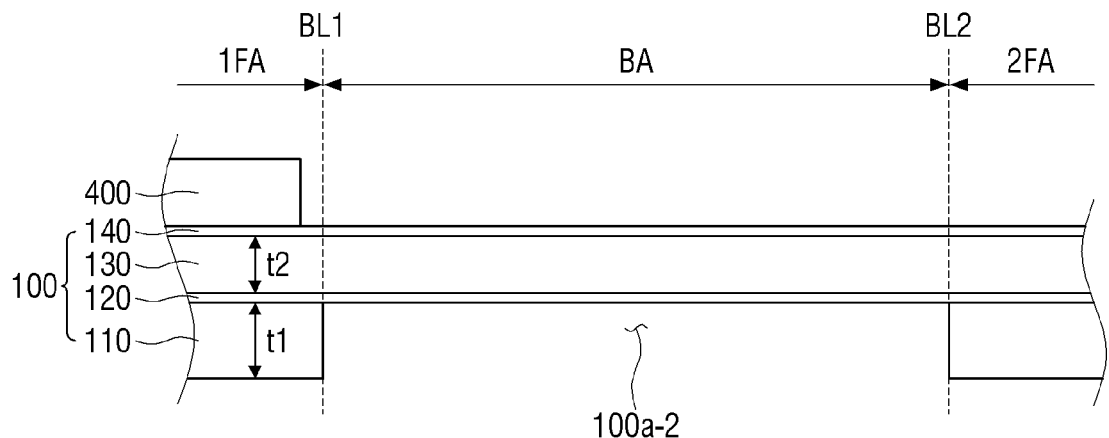
FIG. 7 is an enlarged view of a substrate of FIG. 2 according to an embodiment.

FIG. 6 is an enlarged view of the substrate 100 of FIG. 2 according to an embodiment, and FIG. 7 is an enlarged view of the substrate 100 of FIG. 2 according to an embodiment.

Referring to FIG. 6, the substrate 100 may include a first substrate 110, a first barrier layer 120, a second substrate 130, and a second barrier layer 140 in the second direction (+Y-axis direction). The second substrate 130 is disposed on the first substrate 110, and the first barrier layer 120 is disposed between the first substrate 110 and the second substrate 130. The second barrier layer 140 is disposed on the second substrate 130.

The first barrier layer 120 is a layer for protecting the first substrate 110 vulnerable to moisture permeation, and is disposed on the first substrate 110. The first barrier layer 120 includes an inorganic material. The inorganic material includes at least one of metal oxide, silicon oxide, and silicon nitride. In addition, the first barrier layer 120 may be formed of a plurality of inorganic layers alternately stacked. For example, the first barrier layer 120 may be formed of multiple layers in which one or more inorganic layers of a silicon nitride layer, a silicon oxynitride layer, a silicon oxide layer, a titanium oxide layer, and an aluminum oxide layer are alternately stacked.

The second barrier layer 140 is a layer for protecting the second substrate 130 vulnerable to moisture permeation, and is disposed on the second substrate 130. The second barrier layer 140 may be formed of a plurality of inorganic layers alternately stacked. For example, the second barrier layer 140 may be formed of multiple layers in which one or more inorganic layers of a silicon nitride layer, a silicon oxynitride layer, a silicon oxide layer, a titanium oxide layer, and an aluminum oxide layer are alternately stacked.

As illustrated in FIG. 6, the first substrate 110 has a groove 100a-1 corresponding to the bending area BA. The groove 100a-1 has a shape that is concave in the third direction (Z-axis direction) that is a thickness direction of the first substrate 110. In addition, the groove 100a-1 has a depth t3 equal to or smaller than a thickness t1 of the first substrate 110 in the third direction (Z-axis direction) of the first substrate 110.

As illustrated in FIG. 7, when a groove 100a-2 has a depth t3 equal to the thickness t1 of the first substrate 110 in the third direction (Z-axis direction) of the first substrate 110, the groove 100a-2 is opened. When the groove 100a-2 of the first substrate 110 is opened, the first barrier layer 120 is exposed through the groove 100a-2. That is, the first barrier layer 120 is exposed to outside the substrate 100 at the groove 100a-2.

Figure 8A:
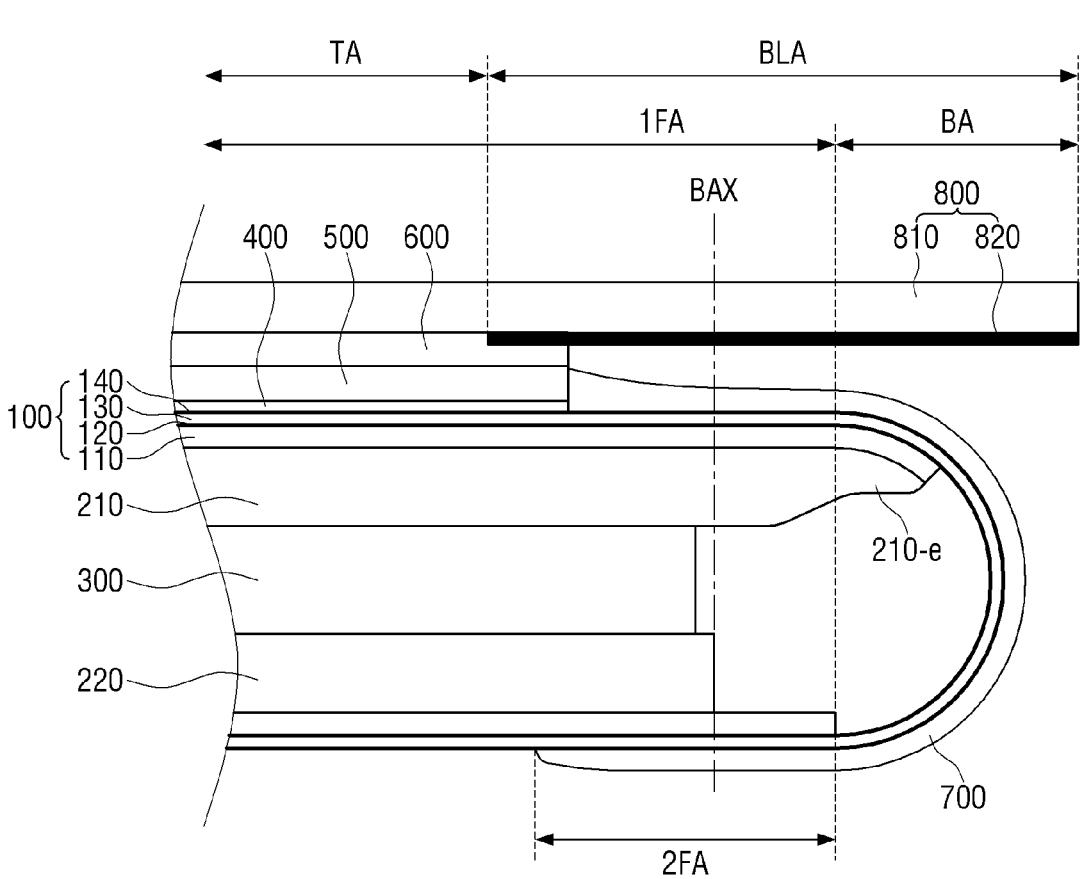
FIG. 8A is a side view of the display device according to an embodiment.
Figure 8B:
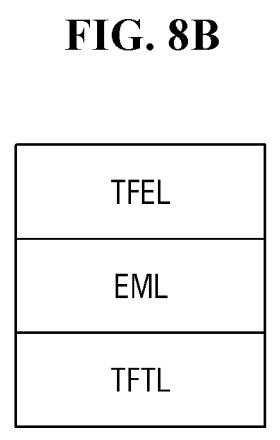

FIG. 8A is a side view (e.g., cross-sectional view) of the display device 10 according to an embodiment. FIG. 8B is an enlarged cross-sectional view of a display unit 400 according to an embodiment.

Referring to FIGS. 8A and 8B, the display device 10 may include a display unit 400, an optical member 500, and a window member 800 on the substrate 100 described in the embodiment of FIG. 3. The display device 10 may further include a cover layer 300. In an embodiment, the optical member 500 together with the display unit 400 may be considered a display unit 400 which provides an image.

The display unit 400 includes a thin film transistor layer TFTL, a light emitting element layer EML, and an encapsulation layer TFEL.

The thin film transistor layer TFTL may be disposed in the display area DA and the non-display area NDA of the substrate 100. The thin film transistor layer TFTL includes thin film transistors.

The light emitting element layer EML may be disposed on the thin film transistor layer TFTL. The light emitting element layer EML may be disposed in the display area DA. The light emitting element layer EML includes light emitting elements disposed in light emitting portions of the display unit 400.

The encapsulation layer TFEL may be disposed on the light emitting element layer EML. The encapsulation layer TFEL may be disposed in the display area DA and the non-display area NDA. The encapsulation layer TFEL includes at least one inorganic layer and at least one organic layer for encapsulating the light emitting element layer.

A touch sensing unit (not illustrated) may be disposed on the encapsulation layer TFEL. The touch sensing unit senses an external input such as the user's touch, by including a plurality of touch electrodes driven in a capacitive manner. The touch sensing unit includes a plurality of touch lines connecting the plurality of touch electrodes and a plurality of touch pads to each other.

The window member 800 is positioned on the substrate 100 on which the display unit 400 is positioned to protect a display panel from external impacts and scratches. The window member 800 may include a light transmitting area TA and a light blocking area BLA which is adjacent to the light transmitting area TA, in plan view. The light transmitting area TA is an area through which light transmits, and an image provided from the display panel may be provided to outside the display device 10 (e.g., to the user) by being transmitted through the light transmitting area TA. The light blocking area BLA may be an area that blocks light transmission. In some embodiments, the light blocking area BLA may be positioned around the light transmitting area TA and may surround the light transmitting area TA in the plan view. In some embodiments, the light transmitting area TA may overlap the display area DA, and the light blocking area BLA may overlap the non-display area NDA. That is, the light blocking area BLA may cover the non-display area NDA.

The window member 800 may include a window 810 and a light blocking member 820 when viewed in a stacked structure.

The window 810 may be made of a material including glass, sapphire, plastic, or the like.

The light blocking member 820 may be positioned on one surface of the window 810 facing the display unit 400. The light blocking member 820 may define a light blocking area BLA of the window member 800. In some embodiments, the light blocking member 820 may be formed of (or include) a colored organic layer, and may be formed on one surface of the window 810 by a coating method or a printing method. Alternatively, in an embodiment, the light blocking member 820 may be formed on a base layer such as a separate transparent layer, and the base layer on which the light blocking member 820 is formed may be attached to one surface of the window 810.

A coupling layer 600 may be positioned between the window member 800 and a display structure DS including the display unit 400, to couple the window member 800 and the display structure DS to each other. Here, the display structure DS includes the substrate 100, the display unit 400, and the optical member 500 together with each other. A space may be defined between the light transmitting area TA of the window member 800 and the display structure DS. The coupling layer 600 may be formed (or provided) to fill an entire space between the light transmitting area TA of the window member 800 and the display structure DS. In some embodiments, the coupling layer 600 may be formed to further fill a portion of a space between the light blocking area BLA of the window member 800 and the display structure DS.

The coupling layer 600 may be made of an ultraviolet light curing resin. In some embodiments, the coupling layer 600 may be made of an optical clear resin (OCR). The coupling layer 600 may be initially applied to the window member 800 in a liquid or paste state, and may be cured by ultraviolet light after the display structure DS is stacked.

The coupling layer 600 may be in contact with one surface of the window 810 of the window member 800. As being in contact, elements may for an interface therebetween The window 810 may also be made of an inorganic material such as glass, or an organic material such as plastic or a polymer material. In order to prevent deterioration of image visibility due to reflection of external light, the optical member 500 may be additionally disposed between the display unit 400 and the window 810.

When the optical member 500 is disposed between the display unit 400 and the window 810, the coupling layer 600 may be further in contact with a top surface of the optical member 500.

Since the coupling layer 600 may initially have a liquid or paste state, partial spreading may occur when the display structure DS and the window member 800 are coupled to each other. Accordingly, the coupling layer 600 may be further in contact with one surface of the light blocking member 820, and may be further in contact with a side surface of the optical member 500.

The optical member 500 may cover the display area DA of the substrate 100 and a portion of the non-display area NDA (e.g., a fan-out area (not illustrated)).

A bending protection layer 700 may be disposed on the first flat area 1FA and the bending area BA of the second substrate 130 on which the optical member 500 is not disposed. An exposed portion of the second substrate 130 may correspond to a portion of the second substrate 130 on which the optical member 500 is not disposed. In addition, the bending protection layer 700 may be disposed on a portion of the second flat area 2FA adjacent to the bending area BA of the second substrate 130.

The bending protection layer 700 may be formed to have a thickness in the bending area BA which is thinner (e.g., smaller) than that in the first flat area 1FA.

The bending protection layer 700 may have a thickness that becomes thinner (e.g., decrease) from the side surface of the optical member 500 toward the bending area BA, and may have a uniform thickness in the bending area BA.

The bending protection layer 700 is positioned on (or along) the side surface of the optical member 500, but the bending protection layer 700 or a constituent material thereof may not be positioned on the top surface (one surface of the window side) of the optical member 500. It is illustrated in the drawing that a height of a top surface of the bending protection layer 700 relative to the substrate 100, for example, is the same as a height of the top surface of the optical member 500 so that the bending protection layer 700 completely covers the side surface of the optical member 500, but is not limited thereto. In an embodiment, the height of the top surface of the optical member 500 may be greater than the height of the top surface of the bending protection layer 700 (e.g., further from the substrate 100 than the top surface of the bending protection layer 700) to expose a portion of an upper end of the side surface of the optical member 500 to outside the bending protection layer 700.

The display device 10 may further include a filler 900 in a groove 100a of the substrate 100 and in a space between the first support layer 210 and the second support layer 220. The filler 900 may be formed by injecting and curing a liquid or paste-type material into the groove and the space between the first support layer 210 and the second support layer 220. The filler 900 may be provided as a material having an adhesion, and may prevent or minimize a deformation of the substrate 100 due to a restoring force to restore the substrate 100 to a state before being bent as it is cured by ultraviolet (UV) or heat.

The cover layer 300 is disposed on a bottom surface of the first support layer 210. The cover layer 300 may be disposed between the first support layer 210 and the second support layer 220 in the third direction (Z-axis direction) in a state in which the substrate 100 is bent. That is, the display device 10 which is bent disposes the first support layer 210 facing the second support layer 220 with the cover layer 300 therebetween.

The cover layer 300 may be formed of a layer having a material having excellent flexibility, insulation, and heat resistance, for example, may be formed of polyimide, but is not limited thereto.

The cover layer 300 may not overlap the edge portion 210-e of the first support layer 210.

Figure 9:
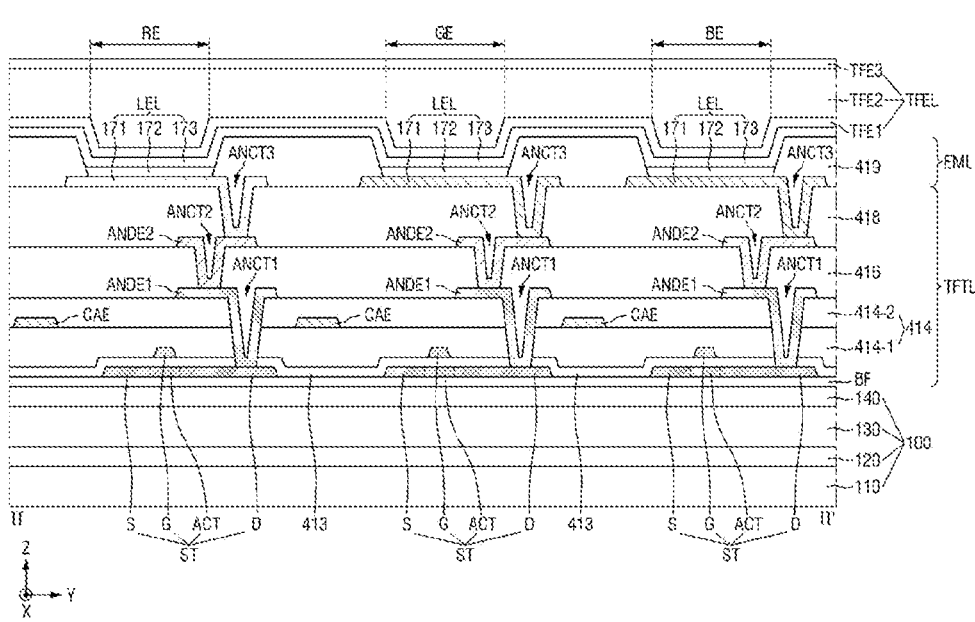
FIG. 9 is a detailed side view of the display device according to an embodiment.

FIG. 9 is a detailed side view (e.g., enlarged cross-sectional view) of the display device 10 according to an embodiment. FIG. 9 is a side view of the display device 10 for illustrating the display unit 400 of FIG. 8A in detail, and thus descriptions of the same components will be omitted.

Referring to FIG. 9, the substrate 100 may include a plurality of first and second substrates 110 and 130, and each of the barrier layers 120 and 140 may be disposed on each of the substrates 110 and 130.

An active layer ACT, a source electrode S, and a drain electrode D of a thin film transistor ST may be disposed on the barrier layer 140. The active layer ACT of the thin film transistor ST includes polycrystalline silicon, single crystal silicon, low-temperature polycrystalline silicon, amorphous silicon, or an oxide semiconductor. The active layer ACT overlapping the gate electrode G in the third direction (Z-axis direction), which is the thickness direction of the substrate 100, may be defined as a channel area. The source electrode S and the drain electrode D are areas that do not overlap the gate electrode G in the third direction (Z-axis direction), and may have conductivity defined by doping a silicon semiconductor or an oxide semiconductor with ions or impurities.

A gate insulating layer 413 may be disposed on the active layer ACT, the source electrode S, and the drain electrode D of the thin film transistor ST. The gate insulating layer 413 may be formed of an inorganic layer, for example, a silicon nitride layer, a silicon oxynitride layer, a silicon oxide layer, a titanium oxide layer, or an aluminum oxide layer.

The gate electrode G of the thin film transistor ST may be disposed on the gate insulating layer 413. The gate electrode G may overlap the active layer ACT in the third direction (Z-axis direction). The gate electrode G may be formed of a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A first interlayer insulating layer 414-1 may be disposed on the gate electrode G of the thin film transistor ST. The first interlayer insulating layer 414-1 may be formed of an inorganic layer, for example, a silicon nitride layer, a silicon oxynitride layer, a silicon oxide layer, a titanium oxide layer, or an aluminum oxide layer. The first interlayer insulating layer 414-1 may be formed of a plurality of inorganic layers.

A capacitor electrode CAE may be disposed on the first interlayer insulating layer 414-1. The capacitor electrode CAE may overlap the gate electrode G of the first thin film transistor ST in the third direction (Z-axis direction). Since the first interlayer insulating layer 414-1 has a predetermined dielectric constant, a capacitor may be formed by the capacitor electrode CAE, the gate electrode G, and the first interlayer insulating layer 414-1 disposed between the capacitor electrode CAE and the gate electrode G. The capacitor electrode CAE may be formed of a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A second interlayer insulating layer 414-2 may be disposed on the capacitor electrode CAE. The second interlayer insulating layer 414-2 may be formed of an inorganic layer, for example, a silicon nitride layer, a silicon oxynitride layer, a silicon oxide layer, a titanium oxide layer, or an aluminum oxide layer. The second interlayer insulating layer 414-2 may be formed of a plurality of inorganic layers.

A first anode connection electrode ANDE1 may be disposed on the second interlayer insulating layer 414-2. The first anode connection electrode ANDE1 may be connected to the drain electrode D of the thin film transistor ST through a first connection contact hole ANCT1 penetrating through the gate insulating layer 413, the first interlayer insulating layer 414-1, and the second interlayer insulating layer 414-2.

The first anode connection electrode ANDE1 may be formed of a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A first planarization layer 416 for planarizing a step caused by the thin film transistor ST may be disposed on the first anode connection electrode ANDE1. The first planarization layer 416 may be formed of an organic layer made of an acryl resin, an epoxy resin, a phenolic resin, a polyamide resin, a polyimide resin, or the like.

A second anode connection electrode ANDE2 may be disposed on the first planarization layer 416. The second anode connection electrode ANDE2 may be connected to the first anode connection electrode ANDE1 through a second connection contact hole ANCT2 penetrating through the first planarization layer 416. The second anode connection electrode ANDE2 may be formed of a single layer or multiple layers made of any one of molybdenum (Mo), aluminum (Al), chromium (Cr), gold (Au), titanium (Ti), nickel (Ni), neodymium (Nd), and copper (Cu), or alloys thereof.

A second planarization layer 418 may be disposed on the second anode connection electrode ANDE2. The second planarization layer 418 may be formed of an organic layer made of an acryl resin, an epoxy resin, a phenolic resin, a polyamide resin, a polyimide resin, or the like.

Light emitting elements LEL and a bank 419 forming a bank layer may be disposed on the second planarization layer 418. Each of the light emitting elements LEL includes a pixel electrode 171, a light emitting layer 172, and a common electrode 173.

The pixel electrode 171 may be disposed on the second planarization layer 418. The pixel electrode 171 may be connected to the second anode connection electrode ANDE2 through a third connection contact hole ANCT3 penetrating through the second planarization layer 418.

In a top emission structure that emits light in a direction of the common electrode 173 with respect to the light emitting layer 172, the pixel electrode 171 may be formed of a metal material having high reflectivity, such as a stacked structure (Ti/Al/Ti) of aluminum and titanium, a stacked structure (ITO/Al/ITO) of aluminum and indium tin oxide (ITO), an APC alloy, and a stacked structure (ITO/APC/ITO) of an APC alloy and ITO. The APC alloy is an alloy of silver (Ag), palladium (Pd), and copper (Cu).

The bank layer including the bank 419 provided in plural is formed to partition the pixel electrode 171 on the second planarization layer 418 and to define a first light emitting portion RE, a second light emitting portion GE, and a third light emitting portion BE at openings provided in the bank layer. The bank 419 may be disposed to cover an edge of the pixel electrode 171. The bank 419 may be formed of an organic layer such as an acrylic resin, an epoxy resin, a phenolic resin, a polyamide resin, or a polyimide resin.

Each of the first light emitting portion RE, the second light emitting portion GE, and the third light emitting portion BE refers to an area in which the pixel electrode 171, the light emitting layer 172, and the common electrode 173 are sequentially stacked and holes from the pixel electrode 171 and electrons from the common electrode 173 are combined with each other in the light emitting layer 172 to emit light.

The light emitting layer 172 may be disposed on the pixel electrode 171 and extend from the pixel electrode 171 and along the bank 419. The light emitting layer 172 may include an organic material to emit light of a predetermined color.

For example, the light emitting layer 172 may include a hole transporting layer, an organic material layer, and an electron transporting layer.

The common electrode 173 may be disposed on the light emitting layer 172. The common electrode 173 may be disposed to cover the light emitting layer 172. The common electrode 173 may be a common layer commonly formed in the first light emitting portion RE, the second light emitting portion GE, and the third light emitting portion BE. A capping layer (not shown) may be formed on the common electrode 173.

In the top emission structure, the common electrode 173 may be formed of a transparent conductive material (TCO) such as ITO or indium zinc oxide (IZO) capable of transmitting light therethrough, or a semi-transmissive conductive material such as magnesium (Mg), silver (Ag), or an alloy of magnesium (Mg) and silver (Ag). When the common electrode 173 is formed of the semi-transmissive conductive material, light emitting efficiency may be increased by a micro cavity.

An encapsulation layer TFEL may be disposed on the common electrode 173. The encapsulation layer TFEL may include at least one inorganic layer to prevent oxygen or moisture from permeating into the light emitting element layer EML. In addition, the encapsulation layer TFEL may include at least one organic layer to protect the light emitting element layer EML from foreign materials such as dust. For example, the encapsulation layer TFEL includes a first encapsulation inorganic layer TFE1, an encapsulation organic layer TFE2, and a second encapsulation inorganic layer TFE3.

The first encapsulation inorganic layer TFE1 may be disposed on the common electrode 173, the encapsulation organic layer TFE2 may be disposed on the first encapsulation inorganic layer TFE1, and the second encapsulation inorganic layer TFE3 may be disposed on the encapsulation organic layer TFE2. The first encapsulation inorganic layer TFE1 and the second encapsulation inorganic layer TFE3 may be formed of multiple layers in which one or more inorganic layers of a silicon nitride layer, a silicon oxynitride layer, a silicon oxide layer, a titanium oxide layer, and an aluminum oxide layer are alternately stacked. The encapsulation organic layer TFE2 may be an organic layer such as an acrylic resin, an epoxy resin, a phenolic resin, a polyamide resin, or a polyimide resin.

As may be seen through a method for manufacturing (or providing) the display device 10 which is disclosed below, one side surface of the support layer 210 may include the edge portion 210-e having an acute angle inclined surface, and the edge portion 210-e may support the bending area of the substrate 100, thereby reducing bending stress applied to the substrate 100 by bending thereof.

Hereinafter, a method for manufacturing (or providing) the display device 10 will be described.

Figure 10:
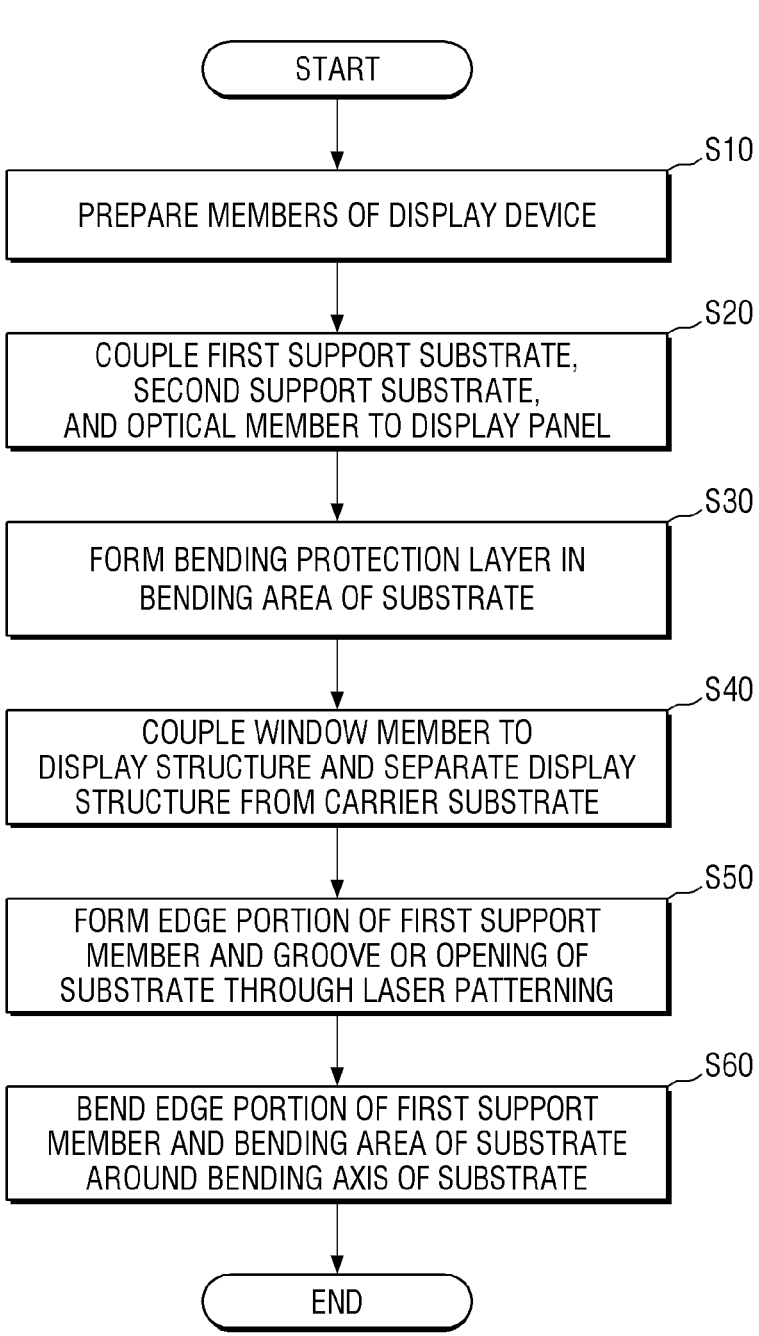
FIG. 10 is a flowchart of a method for manufacturing a display device according to an embodiment.

FIG. 10 is a flowchart of a method for manufacturing (or providing) a display device according to an embodiment, and FIGS. 11 to 15 are enlarged cross-sectional views for each of the processes of the method for manufacturing a display device 10 according to an embodiment. A detailed description of the same components as those described with reference to FIGS. 1 to 9 will be omitted.

As illustrated in FIG. 10, members of a display device 10 are prepared (S10).

The members of the display device 10 include a display panel including a substrate 100 in which a first flat area 1FA, a bending area BA, and a second flat area 2FA are defined along a first direction, and a display unit 400 disposed in the first flat area 1FA of the substrate 100. In addition, the members of the display device 10 may further include a first support layer 210, a second support layer 220, an optical member 500, and a window member 800.

Here, the substrate 100 may be a substrate in which a first flat area 1FA, a second flat area 2FA, and a bending area BA are defined as illustrated in FIG. 1.

Figure 11:
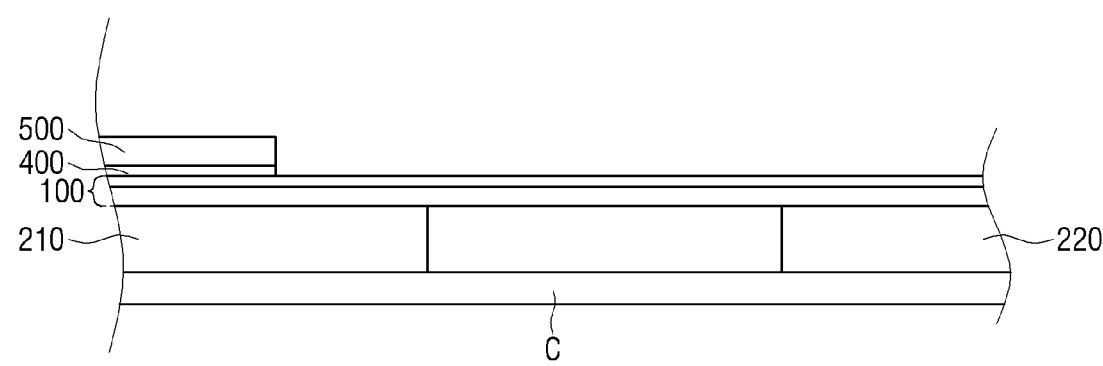
FIGS. 11 to 15 are cross-sectional views for processes of the method for manufacturing a display device according to an embodiment.

As illustrated in FIGS. 10 and 11, the first support layer 210, the second support layer 220, and the optical member 500 are coupled to the prepared display panel (S20).

Here, the carrier substrate C may serve to support the components from the bottom when coupling the components to each other or to other components. The carrier substrate C may include a rigid material. For example, the carrier substrate C may include silicon oxide ($SiO_2$). Furthermore, the carrier substrate C may further include a small amount of impurities as well as silicon oxide ($SiO_2$). The impurities may include aluminum (Al), potassium (K), or sodium (Na). In particular, potassium and sodium may be included in the carrier substrate C in the form of cations, respectively. The impurity of the carrier substrate C may be a factor inducing an electrostatic attraction with the substrate 100. In a process of peeling the carrier substrate C from the substrate 100 to be described later, the impurities may reduce the electrostatic attraction between the carrier substrate C and the substrate 100, specifically, a dipole moment, thereby increasing easiness of peeling therebetween.

The first support layer 210 and the second support layer 220 are disposed to be spaced apart from each other (e.g., disconnected from each other), on one surface of the substrate 100, and the display unit 400 is disposed on the other surface of the substrate 100 which is opposite to the one surface. The optical member 500 is disposed on the display unit 400. Each of the members on which an adhesive member (not shown) is further disposed may further include a coupling layer.

The adhesive member (not shown) may be disposed between the first support layer 210 and the substrate 100, between the second support layer 220 and the substrate 100, and between the substrate 100 and the optical member 500. An upper member and a lower member are coupled to each other with one adhesive member (not shown) as the center (lamination process).

The substrate 100 includes a first substrate 110 and a second substrate 130, a first barrier layer 120 is formed on the first substrate 110, the second substrate 130 is disposed on the first barrier layer 120, and a second barrier layer 140 is formed on the second substrate 130.

The first barrier layer 120 may be formed by using a plasma enhanced chemical vapor deposition (PECVD) method to form a constituent material of the first barrier layer 120 on one surface of the first substrate 110. In addition, the second barrier layer 140 may be formed by using a plasma enhanced chemical vapor deposition (PECVD) method to form a constituent material of the second barrier layer 140 on one surface of the second substrate 130. A thin film transistor layer TFTL, a light emitting element layer EML, and an encapsulation layer TFEL are formed on the second barrier layer 140.

The optical member 500 may be coupled onto the encapsulation layer TFEL. Coupling of the optical member 500 to the stacked structure including the substrate 100 and the display unit 400, may expose a portion of the stacked structure to outside the optical member 500. FIG. 11 shows a portion of the substrate 100 at the flat area and the bending area BA which is exposed to outside the optical member 500 and defines an exposed portion of the substrate 100.

Figure 12:
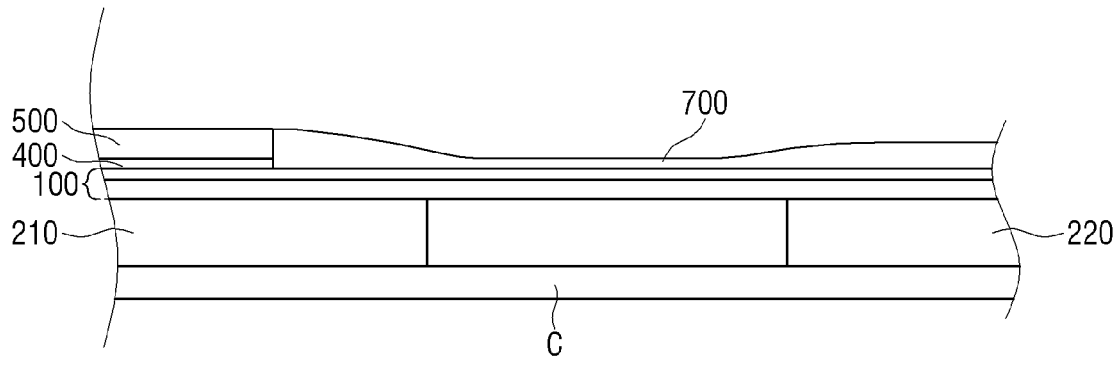

As illustrated in FIGS. 10 and 12, a bending protection layer 700 is formed in a bending area BA of the substrate 100 (S30). The bending protection layer 700 may be formed to completely cover the bending area BA, starting from a side surface of the optical member 500. The bending protection layer 700 may be formed to have a thickness that decreases from the side surface of the optical member 500 and in a direction along the substrate 100 from the optical member 500 toward the bending area BA. In addition, the bending protection layer 700 may have a uniform thickness in the bending area BA. The bending protection layer 700 may be formed by printing or laminating a solder resist or a coverlay film.

Figure 13:
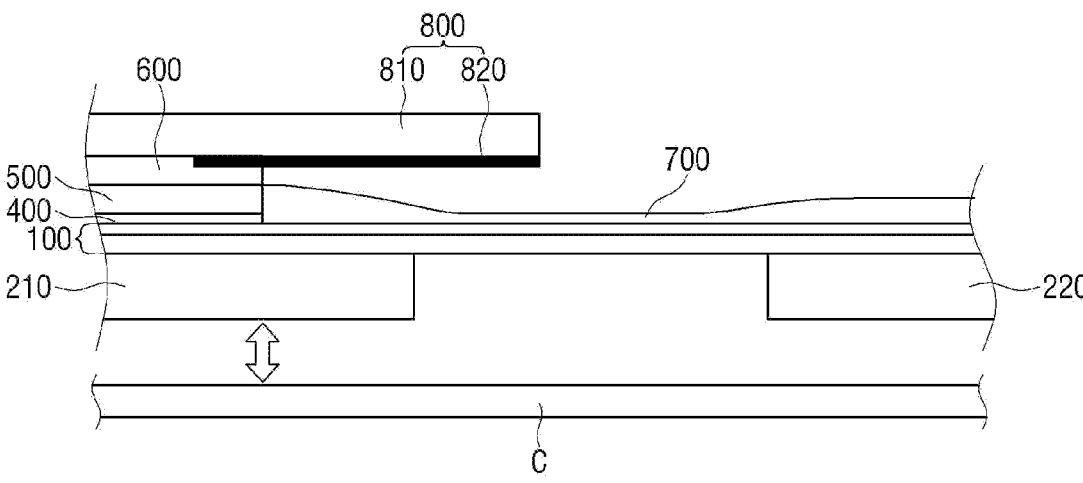

As illustrated in FIGS. 10 and 13, a coupling layer 600 may be positioned between a window member 800 and a display structure DS including the display unit 400 and the optical member 500, to couple the window member 800 and the display structure DS to each other. The stacked structure includes the window member 800 coupled to the display structure DS, and the display structure DS together with the support layer and the window member 800 is separated from the carrier substrate C (S40).

As an example, an optical clear resin (OCR) that initially has a liquid or paste state is applied on the window member 800, which is then stacked on the uppermost end of the display structure DS, that is, the optical member 500. Thereafter, the window member 800 may be coupled onto the display structure DS by curing the optical clear resin OCR by ultraviolet light (UV).

As an example, by disposing an optically clear adhesive (OCA) in the form of a film such as a double-sided tape on the optical member 500, and disposing the window member 800 thereon, the window member 800 may be coupled to the display structure DS.

Referring to FIGS. 11 to 13, for example, a portion of substrate 100 is exposed to outside the support layer and is thereby exposed to the carrier substrate C. As described with reference to FIG. 11, the carrier substrate C may be easily peeled off (e.g., separated) from the substrate 100, which is the lowermost end of the display structure DS, by electrostatic attraction.

Figure 14:
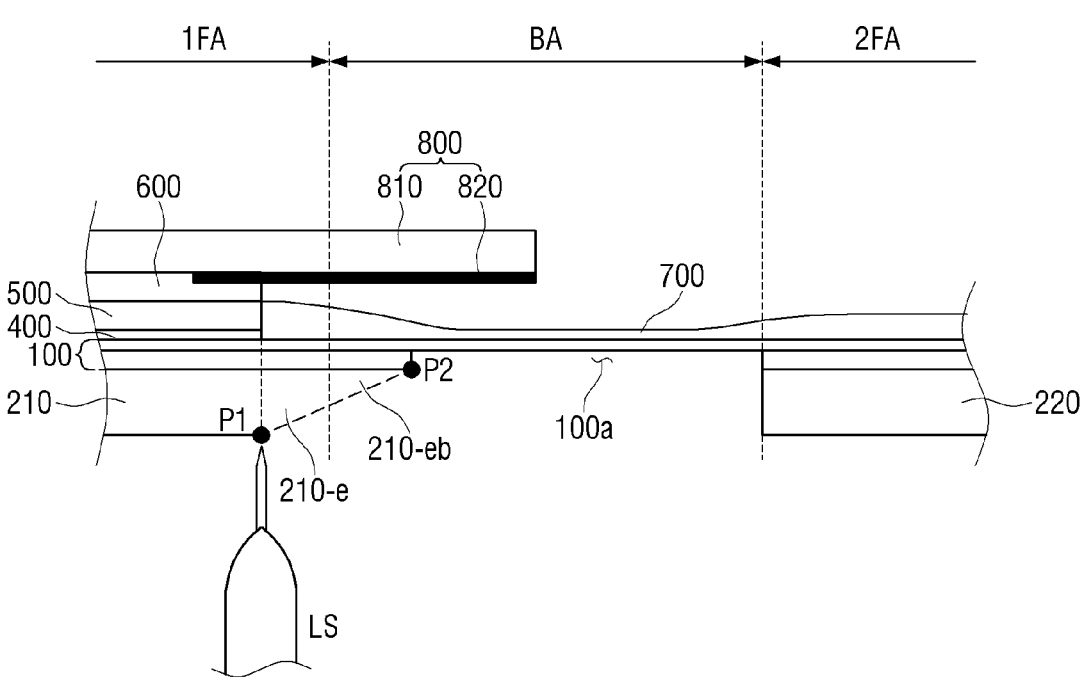

As illustrated in FIGS. 10 and 14, an edge portion 210-e of the first support layer 210 and a groove 100a of the substrate 100 are formed (or provided) such as through laser patterning (S50).

The laser patterning is to form a desired pattern using a laser source LS, and the laser source LS may include a $CO_2$ laser, an Excimer laser, a fiber laser, or the like.

The inclined surface of the edge portion 210-e may be defined along an imaginary inclined line defined from a first point P1 corresponding to the bending axis BAX and located at a bottom surface of the first support layer 210 which is furthest from the substrate 100, and extending to a second point P2 corresponding to an end of the first support layer 210 which is closest to the bending area BA and located at a top surface of the first support layer 210 which is closest to the substrate 100. The edge portion 210-e of the first support layer 210 is formed by irradiating the laser source LS along the imaginary line (xz direction) defined from the first point P1 to the second point P2. The laser source LS may be further irradiated along the Y-axis direction, to define the edge portion 210-e. By such laser irradiation, the first support layer 210 includes the edge portion 210-e having a predetermined inclination angle on a first side surface thereof facing the second support layer 220.

Here, the edge portion 210-e formed in the bending area BA is referred to as a first bending portion 210-eb.

A groove 100a is formed in the first substrate 110 in consideration of a depth of the groove 100a formed in the substrate 100 with respect to a laser irradiation time. A breadth (length in the first direction (X-axis direction)) and a width (length in the second direction (Y-axis direction)) of the groove may coincide with a breadth and a width of the bending area BA. That is, the groove 100a may be formed in the entire bending area (e.g., an entirety of the bending area BA).

Since the first barrier layer 120 (in FIG. 6) provided on the first substrate 110 is formed of an inorganic material, a depth t3 of the groove 100a on the substrate 100 is equal to or smaller than a thickness t1 of the first substrate 110 in the third direction (Z-axis direction). When the depth t3 of the groove 100a is equal to the thickness t1 of the first substrate 110 in the third direction (Z-axis direction), an opening is formed in the substrate 100. The first barrier layer 120 is exposed to outside the substrate 100 through the opening 100a formed in this way.

Figure 15:
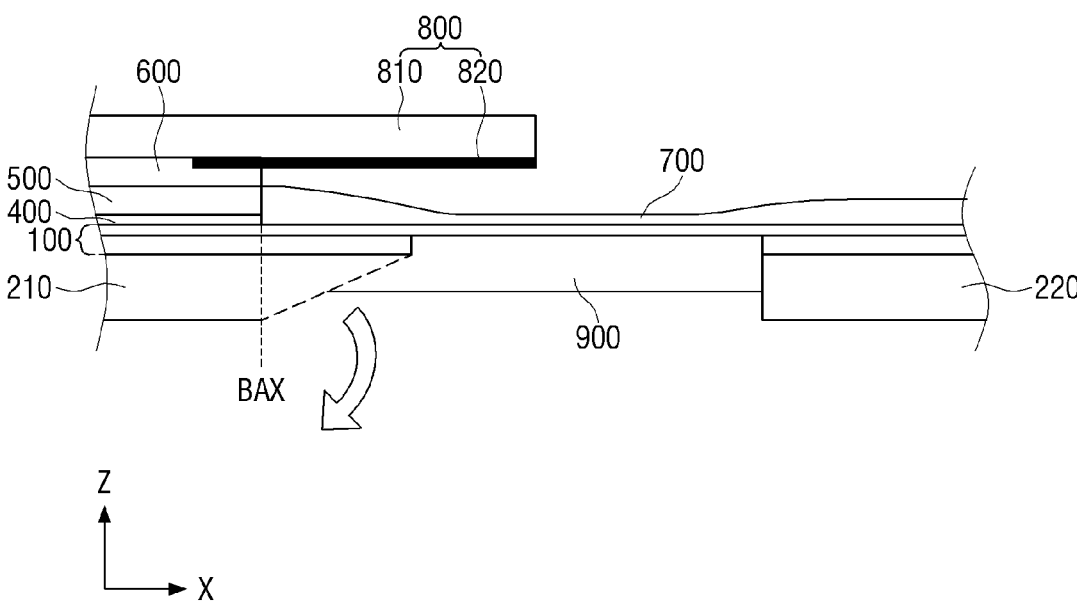

As illustrated in FIGS. 10 and 15, the edge portion 210-e of the first support layer 210, and the bending area BA of the substrate 100 are bent (indicated by the curved arrow in FIG. 15) together with each other and with the display structure DS around the bending axis BAX of the substrate 100 (S60).

In this case, a filler 900 may be filled in a space formed by a separation between the first support layer 210 and the second support layer 220, and a space formed by the edge portion 210-e and the substrate 100 at the groove 100a.

By the bending of the display device 10 at the bending area BA, the edge portion 210-e of the first support layer 210 and the bending area BA of the substrate 100 may be bent. A process of curing a resin material by ultraviolet (UV) or heat may be performed after bending the edge portion 210-e of the first support layer 210 and the bending area BA of the substrate 100. As the resin material is cured to form the filler 900, a deformation of the substrate 100 due to a restoring force restoring the bent substrate 100 to an unbent or less bent state may be prevented or minimized.

Figure 16:
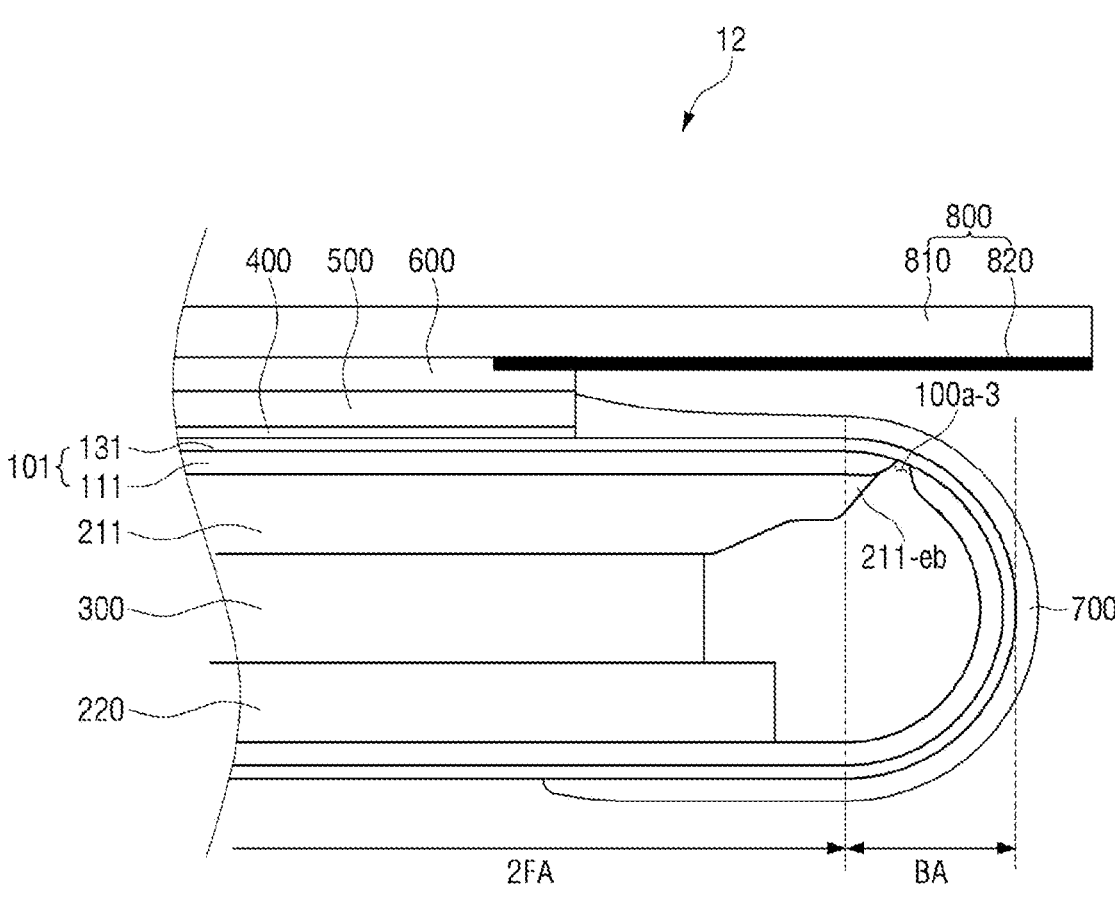
FIG. 16 is a side view of a display device according to an embodiment of the present disclosure.
Figure 16:
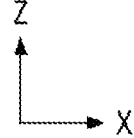

FIG. 16 is a side view of a display device 12 according to an embodiment of the present disclosure.

Since a display device 12 of FIG. 16 is different from the display device 10 illustrated in FIG. 8A only in a breadth (length in the first direction) of a groove 100a-3, a detailed description of the same components and structures will be omitted.

The display device 12 includes a substrate 101, and the substrate 101 includes a first substrate 111 and a second substrate 131.

The second substrate 131 may be disposed on one surface of the first substrate 111, and a first barrier layer (not illustrated) may be disposed between the first substrate 111 and the second substrate 131.

A first support layer 211 and a second support layer 220 may be disposed on the other surface of the first substrate 111.

The first support layer 211 has the first substrate 111 disposed on one surface thereof, and includes a first bending portion 211-eb that has an acute angle of inclination with respect to the other surface overlapping the one surface and overlaps the bending area BA. The first bending portion 211-eb is bent with a predetermined first curvature (e.g., bendable to have a curvature).

A groove 100a-3 that is concave in the third direction (Z axis direction) that is the thickness direction may be formed on the other surface of the first substrate 111. The concave groove 100a-3 may have one end aligned with one end of the first bending portion 211-eb of the first support layer 211. A breadth (e.g., a width) from one end of the groove 100a-3 to the other end facing the one end (in a direction a along the substrate 101, such as the X-axis direction) may be smaller than a thickness of the first support layer 211 along the Z-axis direction.

In an example, the first substrate 111 may include a plurality of concave grooves. The plurality of concave grooves may be disposed to be spaced apart from each other along the bending area BA. Each of the plurality of concave grooves may have the same depth, breadth, and width as the grooves 100a-3, but is not limited thereto.

Figure 17:
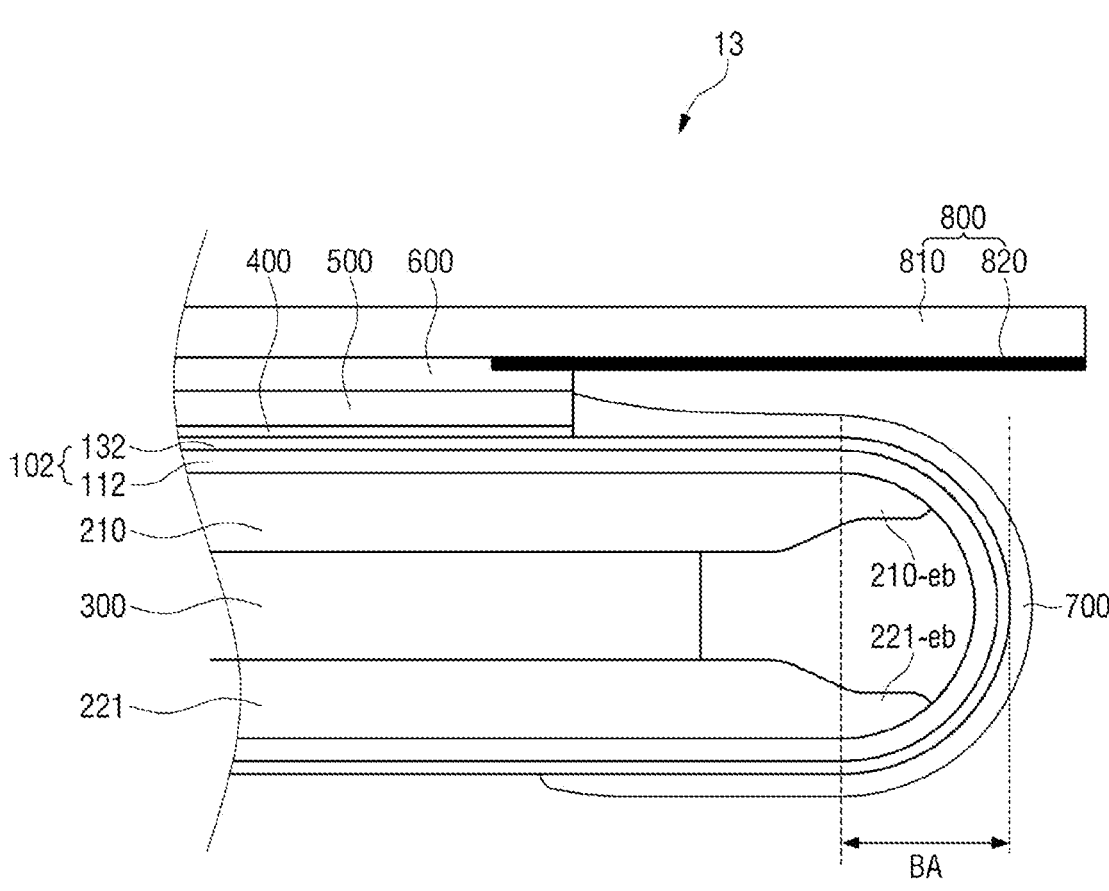
FIG. 17 is a side view of a display device according to an embodiment of the present disclosure.

FIG. 17 is a side view of a display device 13 according to an embodiment of the present disclosure.

A display device 13 of FIG. 17 is an example in which a substrate 102 does not include a groove 100b different from the display device 11 illustrated in FIG. 5.

As illustrated in FIG. 17, the display device 13 includes a substrate 102, the substrate 102 includes a first substrate 112 and a second substrate 132, and the first substrate 112 does not include a groove in the bending area BA.

Figure 18:
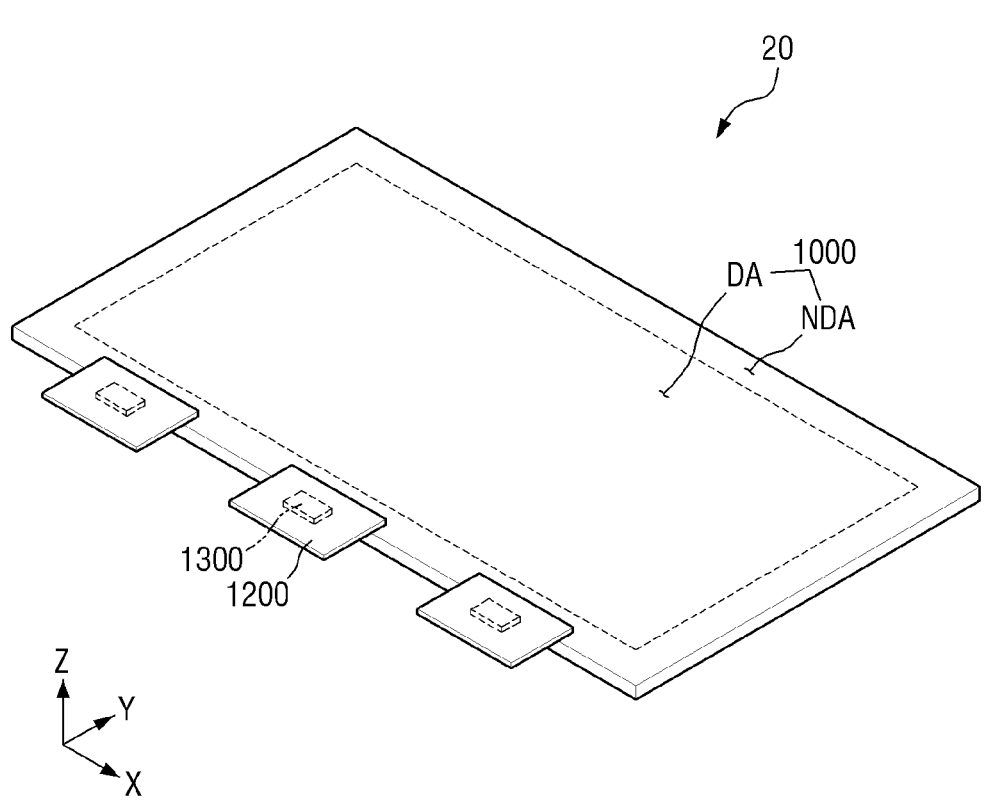
FIG. 18 is a perspective view illustrating a display device according to an embodiment.
Figure 19:
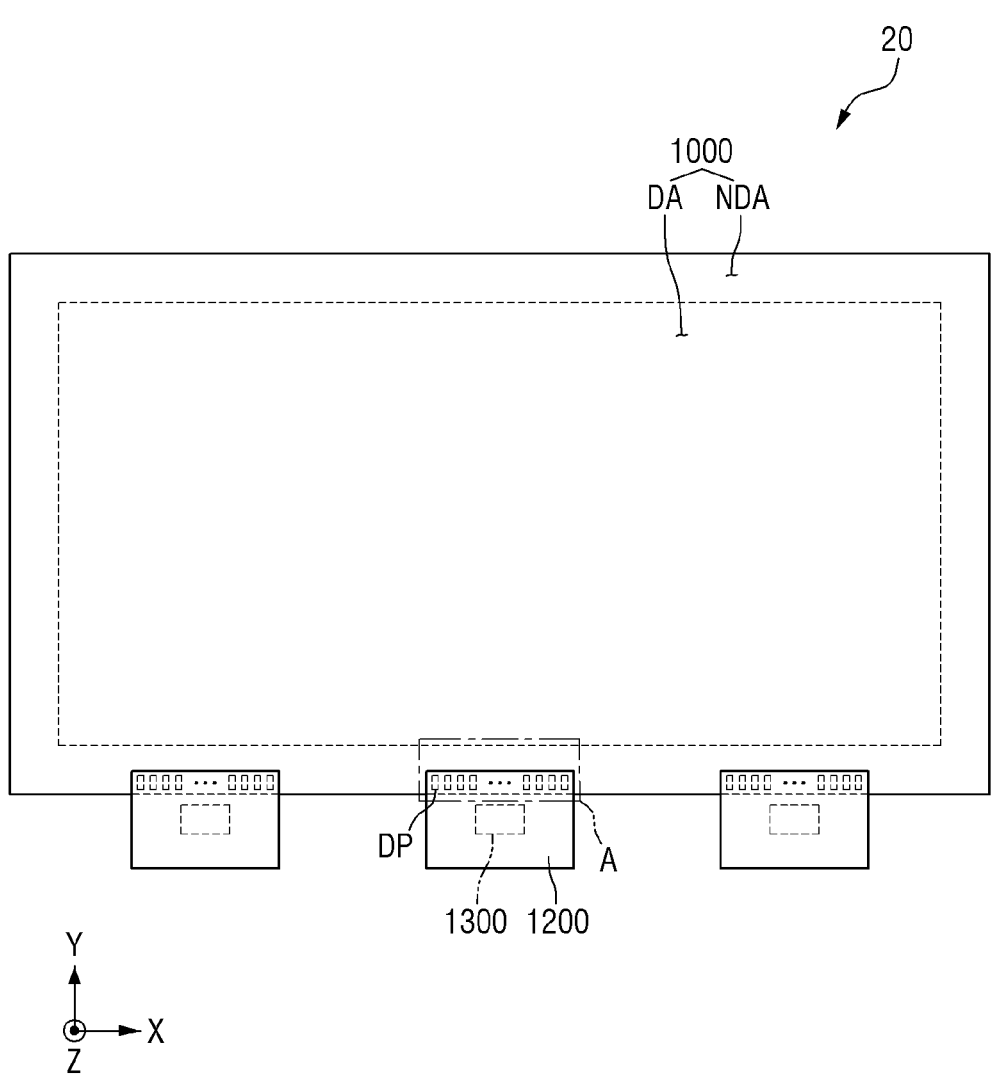
FIG. 19 is a plan view illustrating the display device according to an embodiment.
Figure 20:
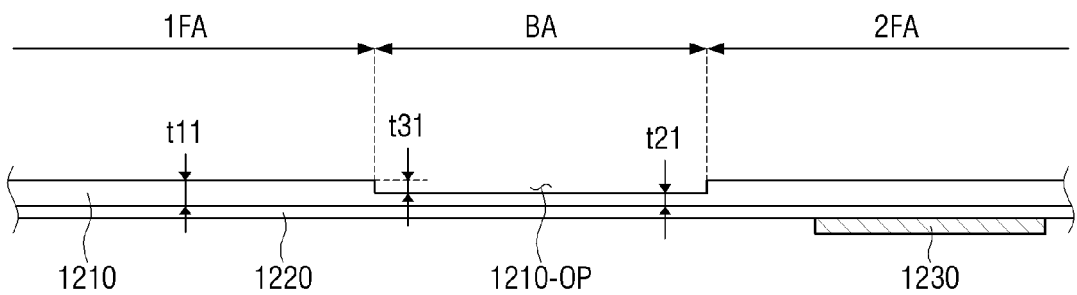
FIG. 20 is a side view illustrating an unfolded state of a circuit board according to an embodiment.
Figure 21:
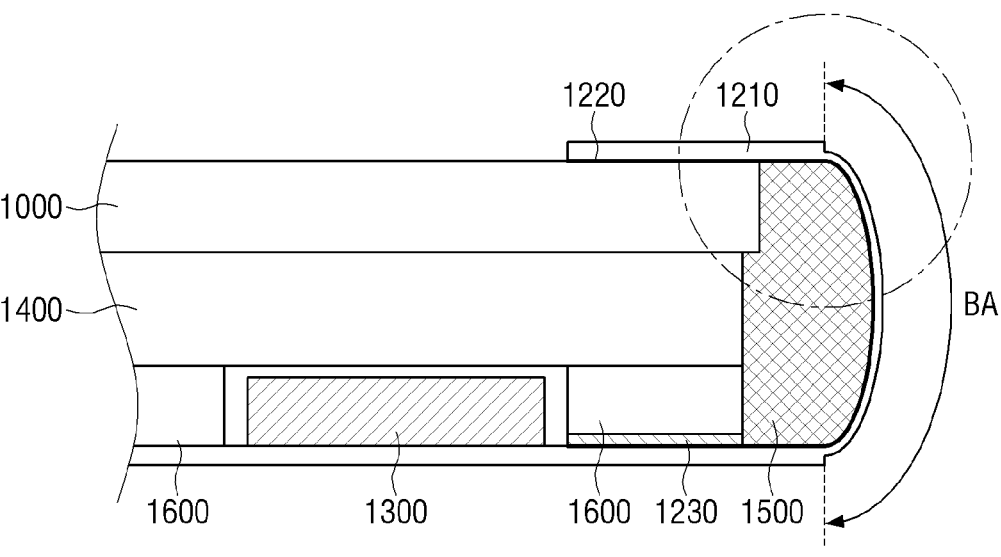
FIG. 21 is a side view of a display device according to an embodiment.

FIG. 18 is a perspective view illustrating a display device 20 according to an embodiment. FIG. 19 is a plan view illustrating the display device 20 according to an embodiment, FIG. 20 is a side view illustrating the display device 20 which is unfolded (e.g., an unfolded state) at a position corresponding to a circuit board 1200 according to an embodiment, and FIG. 21 is a side view of a display device 20 according to an embodiment.

Referring to FIGS. 18 and 19, a display device 20 may be a light emitting display device such as an organic light emitting display device using an organic light emitting diode, a quantum dot light emitting display device including a quantum dot light emitting layer, an inorganic light emitting display device including an inorganic semiconductor, and a micro light emitting display device using a micro or nano light emitting diode (micro LED or nano LED). Hereinafter, it is mainly described that the display device 20 is the organic light emitting display device, but the present disclosure is not limited thereto.

The display device 20 includes a display panel 1000, a circuit board 1200, and a display driving circuit 1300.

The display panel 1000 may be formed in a rectangular plane having long sides in the first direction (X-axis direction) and short sides in the second direction (Y-axis direction) which intersects the first direction (X-axis direction). A corner where the long side in the first direction (X-axis direction) and the short side in the second direction (Y-axis direction) meet may be rounded to have a predetermined curvature in a plan view or may be formed at a right angle in the plan view. The planar shape of the display panel 1000 is not limited to the rectangular shape, and may be other polygonal shapes, a circular shape, or an elliptical shape. The display panel 1000 may be formed to be flat, but is not limited thereto. For example, the display panel 1000 may include curved surface side portions formed at left and right distal ends thereof and having a constant curvature or a variable curvature. In addition, the display panel 1000 may be flexibly formed to be curvable, bendable, foldable or rollable (e.g., curved, bent, folded, or rolled).

The display panel 1000 may include a display area DA displaying an image and a non-display area NDA which is adjacent to the display area DA, such as being disposed around the display area DA. Alternatively, the display panel 1000 may include the display area DA and the non-display area NDA.

The display area DA may occupy most of a planar area of the display panel 1000. The display area DA may be disposed in a center of the display panel 1000, or at least separated from an outer edge of the display panel 1000. Pixels as display elements may be disposed in the display area DA to display an image.

The non-display area NDA may be disposed to be adjacent to the display area DA. The non-display area NDA may be an area outside the display area DA, that is, closer to the outer edge of the display device 20. The non-display area NDA may be disposed to surround the display area DA. The non-display area NDA may be an edge area of the display panel 1000.

A display pad DP provided in plural including display pads DP may be disposed in the non-display area NDA to be connected to the circuit boards 1200. The display pads DP may be disposed on an edge on one side of the display panel 1000. For example, the display pads DP may be disposed on an edge on a lower side of the display panel 1000. The display pads PD may be connected to the pixels in the display area DA, without being limited thereto.

The circuit boards 1200 may be disposed on (or corresponding to) the display pads DP which are disposed on the edge on one side of the display panel 1000. The circuit boards 1200 may be attached to the display pads DP using a low-resistance and high-reliability material such as an anisotropic conductive layer or a self assembly anisotropic conductive paste (SAP). Accordingly, the circuit boards 1200 may be electrically connected to signal lines of the display panel 1000 which transmit electrical signals. The display panel 1000 may receive data voltages, power voltages, scan timing signals, and the like through the circuit boards 1200. The circuit boards 1200 may be a flexible film such as a flexible printed circuit board, a printed circuit board, or a chip on film.

The display driving circuits 1300 may generate data voltages, power voltages, scan timing signals, and the like. The display driving circuits 1300 may supply the data voltages, the power voltages, the scan timing signals, and the like to the display panel 1000, through the circuit boards 1200.

Each of the display driving circuits 1300 may be formed as an integrated circuit (IC) and attached onto the circuit board 1200. Alternatively, the display driving circuits 1300 may be attached onto the display panel 1000 by a chip on glass (COG) method, a chip on plastic (COP) method, or an ultrasonic bonding method.

As illustrated in FIGS. 20 and 21, the display device 20 may further include a cover panel 1400 and a filler 1500.

The cover panel 1400 may perform a heat dissipation function, an electromagnetic wave shielding function, a pattern recognition prevention function, a grounding function, a buffer function, a strength reinforcement function, and/or a digitizing function. The cover panel 1400 may include a functional layer having at least one of the functions described above. The functional layer may be provided in various forms, such as a layer, a film, a sheet, a plate, a panel, and the like. The cover panel 1400 may include one or a plurality of functional layers. For example, the cover panel 1400 may include a buffer sheet, a graphite sheet, and a copper sheet sequentially stacked from the top to the bottom.

The cover panel 1400 may overlap the display panel 1000 in a thickness direction that is the third direction (Z-axis direction). The cover panel 1400 may be attached to a bottom surface of the display panel 1000. A supporting layer 1600 may overlap the cover panel 1400 in a thickness direction that is the third direction (Z-axis direction) and may be attached to a bottom surface of the cover panel 1400. The supporting layer 1600 may prevent an end portion of the display panel 1000 or an end portion of the cover panel 1400 from being bent or deformed by a force applied to the circuit board 1200 for bending of the circuit board 1200. The supporting layer 1600 defines a recess spaced apart from an outer side surface of the supporting layer 1600 and into which one or more display driving circuit 1300 among the display driving circuits 1300 may be inserted.

The circuit board 1200 may be bent in a rear direction of the display panel 1000, from a front side thereof which is opposite to the rear side, to cover a side surface of the display panel 1000, and may further extend to partially overlap the bottom surface of the display panel 1000. However, this is illustrated by way of example and is not limited to any one embodiment.

The circuit board 1200 may include an insulating layer 1210, a line layer 1220, and an insulating layer 1230. The insulating layer 1210 defines an overall shape (e.g., planar shape or planar area) of the circuit board 1200 and may be a base layer on which the line layer 1220 is disposed, such as to define a first insulating layer of the circuit board 1200. The insulating layer 1210 may have flexibility.

The insulating layer 1210 has a first flat area 1FA, a bending area BA, and a second flat area 2FA.

The insulating layer 1210 may have or define a groove 1210-OP in the bending area BA. The groove 1210-OP has a shape that is concave in the third direction (Z-axis direction) that is a thickness direction of the insulating layer 1210. The groove 1210-OP is open in a direction defined from the display panel 1000 to the circuit board 1200. In addition, the groove 1210-OP has a depth t31 smaller than a thickness t11 (e.g., a maximum thickness) of the insulating layer 1210 in the third direction (Z-axis direction) of the insulating layer 1210. Accordingly, the insulating layer 1210 has a thickness t21 at the bending area BA that is smaller than the thickness t11 of the insulating layer 1210 at the first flat area 1FA. The groove 1210-OP may cover the bending area BA, that is, may have a same dimension as the bending area BA of the circuit board 1200, along a plane defined by a first direction and a second direction crossing each other. That is, the non-display area NDA is adjacent to the display area DA along a first direction (e.g., Y-axis direction), the bending area BA of the circuit board 1200 has a width along the first direction and a breadth along a second direction (e.g., X-axis direction) which crosses the first direction, and the groove 1210-OP is provided in an entirety of the bending area BA of the circuit board 1200 to have a same width and a same breadth as the bending area BA.

The line layer 1220 is disposed on one surface of the insulating layer 1210. The line layer 1220 may include a plurality of signal lines (e.g., a signal line layer). The signal lines may be electrically connected to the display panel 1000 and/or the display driving circuit 1300. The signal lines may connect the display panel 1000 to the display driving circuit 1300, without being limited thereto.

The insulating layer 1230 is disposed on one surface of the insulating layer 1210, to cover the line layer 1220, and may otherwise be referred to as a second insulating layer of the circuit board 1200. A portion of the line layer 1220 may also be exposed to outside the insulating layer 1230 (and to outside the circuit board 1200). The insulating layer 1230 does not overlap the bending area BA of the insulating layer 1210. In addition, the insulating layer 1230 does not overlap the groove 1210-OP. The line layer 1220 may be in contact with the filler 1500, at the bending area BA.

The filler 1500 may be formed by injecting and curing a liquid or paste-type material into a space formed by the side surface of the display panel 1000 and the bottom surface of the circuit board 1200, in a state in which the circuit board 1200 is bent. The filler 1500 may be provided as a material having an adhesion, and may prevent or minimize transition of the circuit board 1200 to a less bent or an unbent state due to a restoring force of material and/or layers of the circuit board 1200, as the filler material is cured by ultraviolet (UV) or heat.

Figure 22:
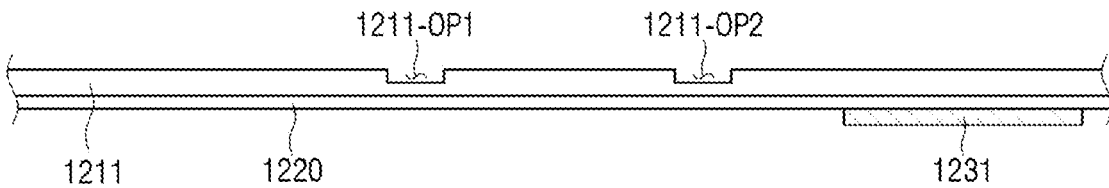
FIG. 22 is a side view illustrating an unfolded state of a circuit board according to an embodiment.
Figure 23:
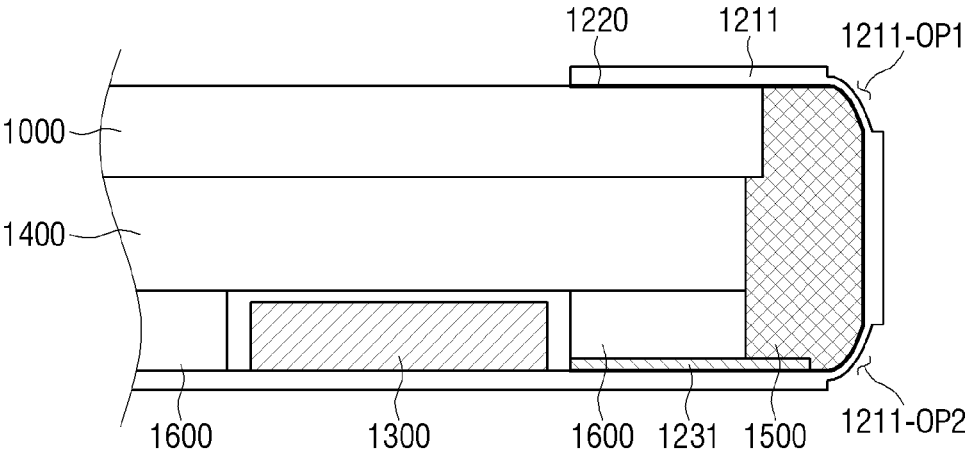
FIG. 23 is a side view of a display device according to an embodiment.

FIG. 22 is a side view illustrating an unfolded state of a circuit board 1200 according to an embodiment, and FIG. 23 is a side view of a display device 20 according to an embodiment.

FIGS. 22 and 23 are different from the display device 20 described with reference to FIGS. 20 and 21 in that the circuit board 1200 is bent at upper and lower surfaces of the display device 20 and flat at the side surface of the display panel 1000, rather than bent along the side surface of the display panel 1000. Such differences will be mainly described, and detailed descriptions of the same components will be omitted.

The circuit board 1200 may include an insulating layer 1211, a line layer 1220, and an insulating layer 1231. The insulating layer 1211 defines an overall shape of the circuit board 1200 and may be a base layer on which the line layer 1220 is disposed. The insulating layer 1211 may have flexibility.

The insulating layer 1211 has a first flat area 1FA, a bending area BA, and a second flat area 2FA.

As illustrated in FIG. 23, a plurality of grooves 1211-OP1 and 1211-OP2 may be formed at both of opposing ends of the bending area BA in the second direction. As an example, the first groove 1211-OP1 may be formed at a boundary point (e.g., boundary) where the first flat area 1FA and the bending area BA meet, and the second groove 1211-OP2 may be formed at a boundary point (e.g., a boundary) where the second flat area 2FA and the bending area BA meet.

The insulating layer 1211 may have (or define) the plurality of grooves 1211-OP1 and 1211-OP2 in the bending area BA. The grooves 1211-OP1 and 1211-OP2 have a shape that is concave in the third direction (Z axis direction) that is a thickness direction of the insulating layer 1211. In addition, the groove 1210-OP has a depth t31 smaller than a thickness t11 of the insulating layer 1210 in the third direction (Z-axis direction) of the insulating layer 1211. Accordingly, the insulating layer 1211 has a thickness t21 at multiple locations along the bending area BA that is smaller than the thickness t11 of the insulating layer 1211 remaining locations along the bending area BA and at the flat areas. Each of the grooves 1211-OP1 and 1211-OP2 may have a dimension corresponding to an entirety of the bending area BA along the X-axis direction to cover a portion the bending area BA, without being limited thereto.

The thickness portion of the insulating layer 1211 which has the thickness t11 may define a flat portion of the insulating layer 1211 within the circuit board 1200 which is bent along the outer side surface of the stacked structure (e.g., display panel 1000 together with the cover panel 1400 and/or supporting layer 1600). The thickness portion of the insulating layer 1211 which has the thickness t21 may define a curved portion of the insulating layer 1211 within the circuit board 1200 which is bent. Since the filler 1500 may be formed by injecting and curing a liquid or paste-type material into a space formed by the outer side surface of the stacked structure and the bottom surface of the circuit board 1200 which is bent, the filler 1500 may have a surface which is curved at both the front and rear of the display device 20 but flat at the side surface of the display device 20.

Figure 24:
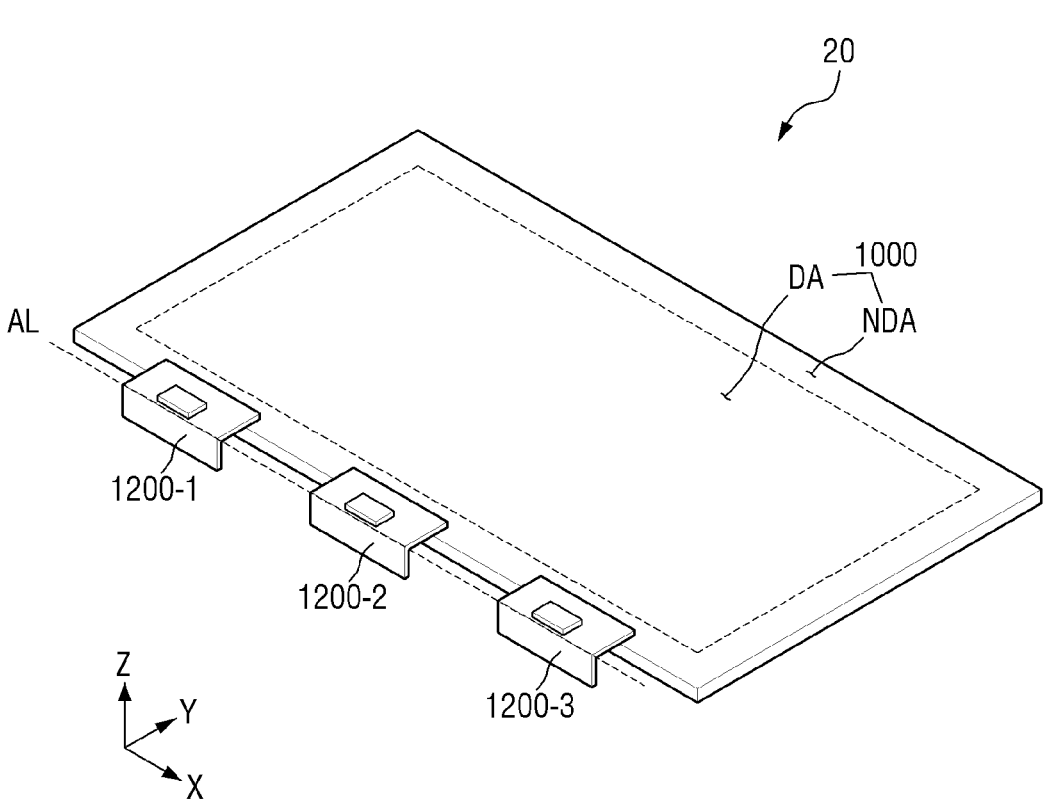
FIG. 24 is a perspective view illustrating a display device in a state in which a circuit board is bent according to an embodiment.

FIG. 24 is a perspective view illustrating a display device 20 in a state in which a circuit board 1200 is bent according to an embodiment.

According to an embodiment, the bending area BA may be controlled by forming a groove 1210-OP in the circuit board 1200. Accordingly, as illustrated in FIG. 24, when the display device 20 includes a plurality of circuit boards 1200-1, 1200-2, and 1200-3, a folding axis of each of a plurality of bent circuit boards may be easily aligned along an alignment axis AL.

However, the aspects of the disclosure are not restricted to the one set forth herein. The above and other aspects of the disclosure will become more apparent to one of daily skill in the art to which the disclosure pertains by referencing the claims, with functional equivalents thereof to be included therein.

What is claimed is:

1. A display device comprising:
a substrate including:
  a bending area which is bendable,
  a flat area which is adjacent to the bending area, and
  a first surface and a second surface opposite to each other;
a display unit which displays an image, the display unit corresponding to the flat area of the substrate and on the first surface of the substrate;
a support layer which is on the second surface of the substrate and corresponds to the flat area, the support layer being disconnected at the bending area to define an end portion of the support layer which is closest to the bending area; and
the substrate defining a groove in the bending area, the groove being open in a direction defined from the display unit to the substrate,
wherein
the end portion of the support layer is bendable together with the substrate and includes:
  a flat portion corresponding to the flat area of the substrate,
  a bending portion in the bending area of the substrate, and
  the bending portion of the support layer including an end closest to the bending area of the substrate, and
the groove defined by the substrate includes an end aligned with the end of the bending portion of the support layer.

2. The display device of claim 1, wherein the substrate which is bent at the bending area disposes the bending portion of the support layer having a curvature.

3. The display device of claim 2, wherein
the bending portion of the end portion of the support layer is provided in plural including a first bending portion and a second bending portion spaced apart each other by the bending area, and
the substrate which is unbent at the bending area disposes the first bending portion having a first acute angle of inclination with respect to the second surface of the substrate, together with the second bending portion having a second acute angle of inclination with respect to the second surface of the substrate.

4. The display device of claim 3, wherein the substrate which is bent at the bending area disposes the first bending portion of the support layer having a first curvature, together with the second bending portion of the support layer having a second curvature.

5. The display device of claim 3, wherein the groove defined by the substrate includes:

a first end of the groove which is aligned with a first end of the first bending portion of the support layer, the first end of the support layer being closest to the bending area of the substrate, and a second end of the groove which is opposite to the first end of the grove and aligned with a second end of the second bending portion of the support layer, the second end of the support layer being closest to the bending area.

6. The display device of claim 1, wherein the substrate further includes:

a first substrate layer, a first barrier layer, a second substrate layer and a second barrier layer sequential from the support layer, and the groove is defined in the first substrate layer.

7. The display device of claim 6, wherein a depth of the groove is smaller than a thickness of the first substrate layer.

8. The display device of claim 6, wherein a depth of the groove is equal to a thickness of the first substrate layer, and the first barrier layer is exposed to outside the substrate by the groove.

9. The display device of claim 6, wherein the first barrier layer includes an inorganic material.

10. The display device of claim 9, wherein the inorganic material includes metal oxide, silicon oxide or silicon nitride.

11. The display device of claim 9, wherein the first substrate layer or the second substrate layer includes an organic material.

12. The display device of claim 11, wherein the organic material contains polyimide, polyethylenenapthalate, polyethyleneterephthalate, polyarylate, polycarbonate, polyetherimide or polyethersulfone.

13. The display device of claim 6, wherein a thickness of the first substrate layer is greater than a thickness of the second substrate layer.

14. The display device of claim 1, wherein the substrate which is unbent at the bending area disposes the bending portion of the support layer having a linear shape and an acute angle of inclination with respect to the second surface of the substrate.

15. The display device of claim 1, further comprising:

an optical member on the display unit; and a bending protection layer extending along the first surface of the substrate, covering the bending area of the substrate and being in contact with a side surface of the optical member, the side surface of the optical member being closest to the bending area, wherein the bending protection layer has a thickness which decreases from the side surface of the optical member toward the bending area, together with a uniform thickness in the bending area.

16. A method for providing a display device, the method comprising:

providing a display panel including:

a substrate including a bending area which is bendable, a flat area which is adjacent to the bending area, and a first surface and a second surface opposite to each other, and a display unit which provides an image, on the first surface of the substrate;

providing an optical member on the first surface of the substrate and facing the substrate with the display unit therebetween;

providing a support layer on the second surface of the substrate and disconnected at the bending area of the substrate, the support layer including:

an end portion closest to the bending area, the end portion including a flat portion corresponding to the flat area of the substrate, and a bending portion in the bending area of the substrate, and the bending portion of the support layer including an end closest to the bending area of the substrate, and the bending portion having an acute angle of inclination with respect to the second surface of the substrate; and bending the bending area of the substrate, which bends the bending portion of the support layer together with the substrate, wherein the providing of the bending portion of the support layer provides a groove in the substrate, at the bending area, the groove being open in a direction from the display panel to the support layer and including an end aligned with the end of the bending portion of the support layer.

17. The method of claim 16, wherein the bending portion of the end portion of the support layer is provided in plural including:

a first bending portion having a first acute angle of inclination with respect to the second surface of the substrate, and a second bending portion spaced apart from the first bending portion at the bending area and having a second acute angle of inclination.

18. The method of claim 16, wherein the providing of the bending portion of the support layer which provides the groove in the substrate, includes laser patterning the support layer and the substrate, at the bending area.

19. The method of claim 16, wherein the substrate which is bent together with the support layer defines a space between the support layer and the substrate, further comprising providing a filler in the space between the support layer and the substrate.

20. The method of claim 16, further comprising providing a bending protection layer in the bending area of the substrate, wherein the providing of the bending protection layer includes defining a thickness of the bending protection layer which decreases from the optical member toward the bending area, together with a thickness of the bending protection layer in the bending area which is uniform.

21. A display device comprising:

a display panel including:

a display area, and a non-display area adjacent to the display area and defining an end of the display panel;

a circuit board which is attached to the display panel at the non-display area, the circuit board including:

a flat area corresponding to the non-display area, a bending area which extends from the flat area, in a direction away from the display panel, and is bendable around the end of the display panel, and a groove defined in the bending area, wherein the circuit board bent around the end of the display panel include the groove being open in a direction away from the display panel.

22. The display device of claim 21, wherein the circuit board further includes:

a first insulating layer defining a planar shape of the circuit board;

a signal line layer between the first insulating layer and the display panel;

a second insulating layer facing the first insulating layer with the signal line layer therebetween; and the first insulating layer defining the groove.

23. The display device of claim 22, wherein the second insulating layer is spaced apart from the groove, in a direction along the first insulating layer.

24. The display device of claim 21, wherein the non-display area of the display panel is adjacent to the display area along a first direction, the bending area of the circuit board has a width along the first direction and a breadth along a second direction which crosses the first direction, and the groove is provided in an entirety of the bending area of the circuit board to have a same width and a same breadth as the bending area.

25. The display device of claim 21, wherein the non-display area of the display panel is adjacent to the display area along a first direction, and the circuit board further includes:

the groove of the circuit board is provided in plural including a plurality of grooves arranged along the first direction, a boundary between the flat area and the bending area, and at least one groove among the plurality of grooves includes an end corresponding to the boundary between the flat area and the bending area.

26. The display device of claim 22, wherein the circuit board which is bent at the bending area defines a space between the circuit board and the end of the display panel, further comprising a filler in the space between the circuit board and the end of the display panel.

27. The display device of claim 26, wherein the circuit board which is bent at the bending area disposes the filler in contact with the signal line layer, in the bending area.

* * * * *